US012733470B2

(12) United States Patent
Kim et al.

(10) Patent No.: US 12,733,470 B2
(45) Date of Patent: Sep. 8, 2026

(54) CONTACT PATTERNING

(71) Applicant: Tokyo Electron Limited, Tokyo (JP)

(72) Inventors: Hojin Kim, Albany, NY (US); Minseok Oh, Albany, NY (US); Soo Doo Chae, Albany, NY (US); Toru Hisamatsu, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 380 days.

(21) Appl. No.: 18/426,962

(22) Filed: Jan. 30, 2024

(65) Prior Publication Data

US 2025/0246481 A1 Jul. 31, 2025

(51) Int. Cl.
*H10W 20/00* (2026.01)

(52) U.S. Cl.
CPC ....... *H10W 20/074* (2026.01); *H10W 20/056* (2026.01); *H10W 20/081* (2026.01)

(58) Field of Classification Search
None
See application file for complete search history.

(56) References Cited

U.S. PATENT DOCUMENTS

| | | | |
|---|---|---|---|
| 10,002,787 | B2 | 6/2018 | Yu et al. |
| 10,734,244 | B2 | 8/2020 | Kim et al. |
| 2016/0020169 | A1 | 1/2016 | Matsuda |
| 2016/0358855 | A1 | 12/2016 | Oh |
| 2023/0069307 | A1 | 3/2023 | Shimomura |

FOREIGN PATENT DOCUMENTS

| | | | |
|---|---|---|---|
| CN | 114784010 | A | 7/2022 |
| KR | 20160024592 | A | 3/2016 |
| KR | 20160143261 | A | 12/2016 |

OTHER PUBLICATIONS

Kwon, S. et al., "Characterization of Via Etching in CHF3/CF4 Magnetically Enhanced Reactive Ion Etching Using Neural Networks," ETRI Journal, vol. 24, No. 3, Jun. 2002, 10 pages.

Sang, B. et al., "Selective dry etching of TiN nanostructures over SiO2 nanotrenches using a Cl2/Ar/N2 inductively coupled plasma," J. Vac. Sci. Technol. B, Nanotechnology and Microelectronics: Materials, Processing, Measurement, and Phenomena, 34 (2), Mar./Apr. 2016, American Vacuum Society, 6 pages.

Stevens, E. et al., "Area-Selective Atomic Layer Deposition of TiN, TiO2, and HfO2 on Silicon Nitride with inhibition on Amorphous Carbon," Chemistry of Materials, vol. 30, Apr. 27, 2018, 10 pages, ACS Publications.

International Search Report and Written Opinion, PCT No. PCT/US2024/057059, Mailed Mar. 12, 2025, Total pp. 12.

*Primary Examiner* — Marvin Payen
(74) *Attorney, Agent, or Firm* — Slater Matsil, LLP

(57) ABSTRACT

A method of forming contacts includes forming a conformal etch stop layer over a staircase layer stack substrate, the staircase layer stack substrate including a plurality of steps on a substrate, each step including a pair of a first layer and a second layer and having a sidewall extending from one step to another step. The method further includes patterning the etch stop layer to remove portions of the etch stop layer covering the sidewalls of the steps and form islands of the etch stop layer. The method further includes replacing the second layer with a conductive material and simultaneously forming contact features through the islands of the etch stop layer to the conductive material, the contact features to different steps of the plurality of steps having different lengths.

18 Claims, 17 Drawing Sheets

200
206
204
206
204
202
270

200
206

200
208
204
206
202

200
208

200
214
212
210
208
206
202
216

200
210
214

200
214
212
210
208
202
216

200
206
214

200
218
208
206
202

200
216
214
718
208
206
204
204
204
202

200
216
214
718
208
206
204
202

200
718
214

200
208
214

200
206
214

200
216
214
718
208
206
204
202

200
718
208
206
204
206
202

200
1204
1202
206
204
206
206
204
202
1216

200
1216
1204
1202
206
206
204
204
202

206
1204
200

200
1206
1202
206
204
204
202

1202
206
200

200
1218
1210
424
204
204
204
424
204
202

200
220
1218
1210
424
424
424
204
204
204
204
202

200
1210
1218

200
1210
220
1218

200
220
1218
1210
424
424
204
204
204
202

200
424
1210
220
1218

CONTACT PATTERNING

TECHNICAL FIELD

The present invention relates generally to the field of semiconductor manufacturing, and, more specifically, to methods for forming contacts.

BACKGROUND

Semiconductor storage devices, such as NAND Flash memory, have grown to play an indispensable role in today's digital society, broadly used in diverse applications such as personal computers, smartphones, and other digital electronic devices. The escalating demand for higher storage capacities and increased performance has made it essential to develop newer types of NAND memory technologies.

Traditionally, 2D NAND memory chips or planar NAND technologies have been extensively used. However, a shift towards the employment of 3D NAND fabrication is clear, given the advantages offered by this technology, mainly relating to substantially higher storage capacity, reduced cost per gigabyte, and better longevity.

One of the key challenges in 3D NAND fabrication is processing irregularities and constraints in the scaling of the wordline layers that progressively manifest with every added layer. One prominent strategy towards mitigating such difficulties incorporates forming a staircase substrate on the wordline layers, which provides the necessary access to individual memory cells.

Current staircase substrate processing methods implement serial patterning for contact patterning. However, as the number of layers of the staircase substrate increases, the number of patterning steps increases. In addition, the patterning time increases for the lower levels causing erosion of conductive materials in the underlying layers of the staircase substrate.

SUMMARY

A method of forming contacts includes forming a conformal etch stop layer over a staircase layer stack substrate, the staircase layer stack substrate including a plurality of steps on a substrate, each step including a pair of a first layer and a second layer and having a sidewall extending from one step to another step. The method further includes patterning the etch stop layer to remove portions of the etch stop layer covering the sidewalls of the steps and form islands of the etch stop layer. The method further includes replacing the second layer with a conductive material and simultaneously forming contact features through the islands of the etch stop layer to the conductive material, the contact features to different steps of the plurality of steps having different lengths.

Another method of forming contacts includes forming a conformal amorphous layer over a staircase layer stack substrate, the staircase layer stack substrate including a plurality of steps on a substrate, each step including a pair of a first layer and a second layer and having a sidewall extending from one step to another step. The method further includes forming first openings within the amorphous layer using a first mask including a pattern for first features. The method further includes exposing the amorphous layer to a hydrogen plasma. After the exposing, the method further includes selectively depositing, using an area selective deposition process, etch stop regions within the first openings. The method further includes replacing the second layer with a conductive material. And the method further includes simultaneously forming contact features through the etch stop regions to the conductive material, the contact features to different steps of the plurality of steps having different lengths.

A substrate processing method includes depositing an etch stop layer over a staircase layer stack substrate, the staircase layer stack substrate including a plurality of steps, each step including a pair of a first layer and a second layer and having an edge with a sidewall extending from one step to another step. The substrate processing method further includes depositing a protective layer over the etch stop layer, and depositing and patterning a planarizing layer over the protective layer to expose the protective layer on the sidewalls of the staircase layer stack substrate. The substrate processing method further includes etching the exposed protective layer and an underlying portion of the etch stop layer until the sidewall of each of the plurality of steps is exposed, the etching removing portions of the etch stop layer from the sidewalls between steps of the staircase layer stack substrate. And the substrate processing method further includes depositing a second planarizing layer over the staircase layer stack substrate.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Semiconductor manufacturing often involves the fabrication of memory devices, such as a 3D NAND structure. 3D NAND fabrication processes continue to increase in complexity as device size decreases and the number of layers stacked increases. Consequently, existing techniques for forming 3D NAND structures are intricate processes involving serial patterning and serial etching, which are costly and time consuming. Proposed solutions suggest simultaneously patterning and therefore subsequently simultaneously etching contacts for the first metal level (M1). But such simultaneous etching results in degradation of the conductive layer, which results from the large etching time during the simultaneous etching process. As the number of layers in 3D NAND increases, the etching time to form contacts increases, which further degrades conductive layers when using simultaneous techniques.

This disclosure presents multiple embodiment methods for processing a substrate to form contacts. Each embodiment method incorporates the use of multiple etch stop layers to prevent conductive layer degradation and enable simultaneous etching of contacts. Through the use of the multiple etch stop layers in the embodiments of this disclosure, the total number of processing steps is reduced, which reduces the total manufacturing cost and total processing time. Further, incorporating the etch stop layers increases device yield and increases throughput (even as the number of layers stacked increases).

Figure 1:
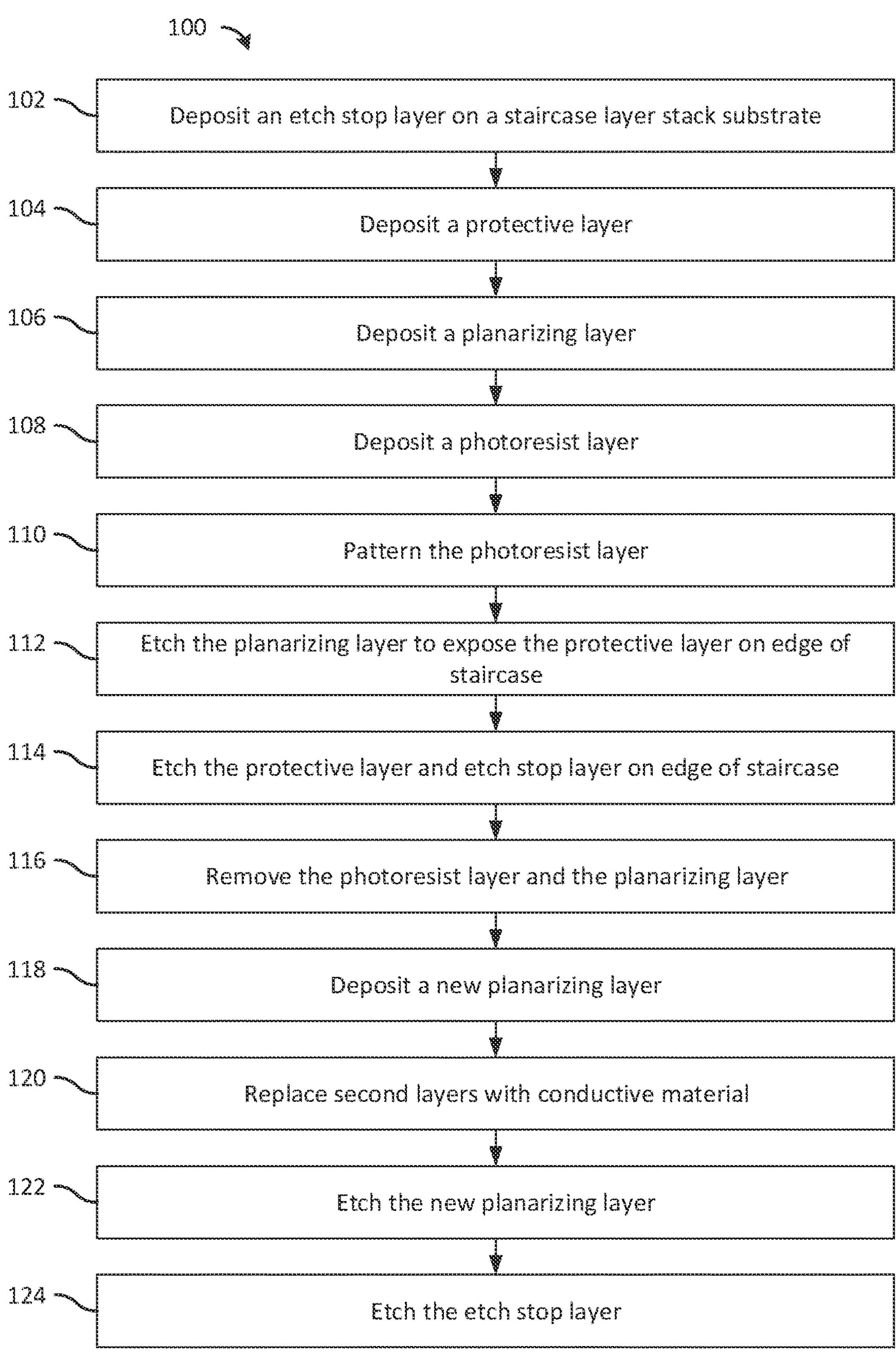
FIG. 1 is a flowchart illustrating a substrate processing method according to an embodiment.

Embodiments provided below describe various methods for processing a substrate to form contacts, and in particular, methods using an etch stop layer at the top of a layer stack to prevent conductive layer degradation. The following description describes the embodiments. A method for processing a substrate to form contacts using an etch stop layer and a protective layer is described using the flowchart of FIG. 1. The embodiment method of FIG. 1 is illustrated in the cross-sectional view schematic diagrams of FIGS. 2A-2G. The embodiment method of FIG. 1 is also illustrated in the aerial view schematic diagrams of FIGS. 3A-3F. The embodiment method of FIG. 1 is further illustrated in the cross-sectional view schematic diagrams of FIGS. 4A-4C and the aerial view schematic diagram of FIG. 5.

Figure 6:
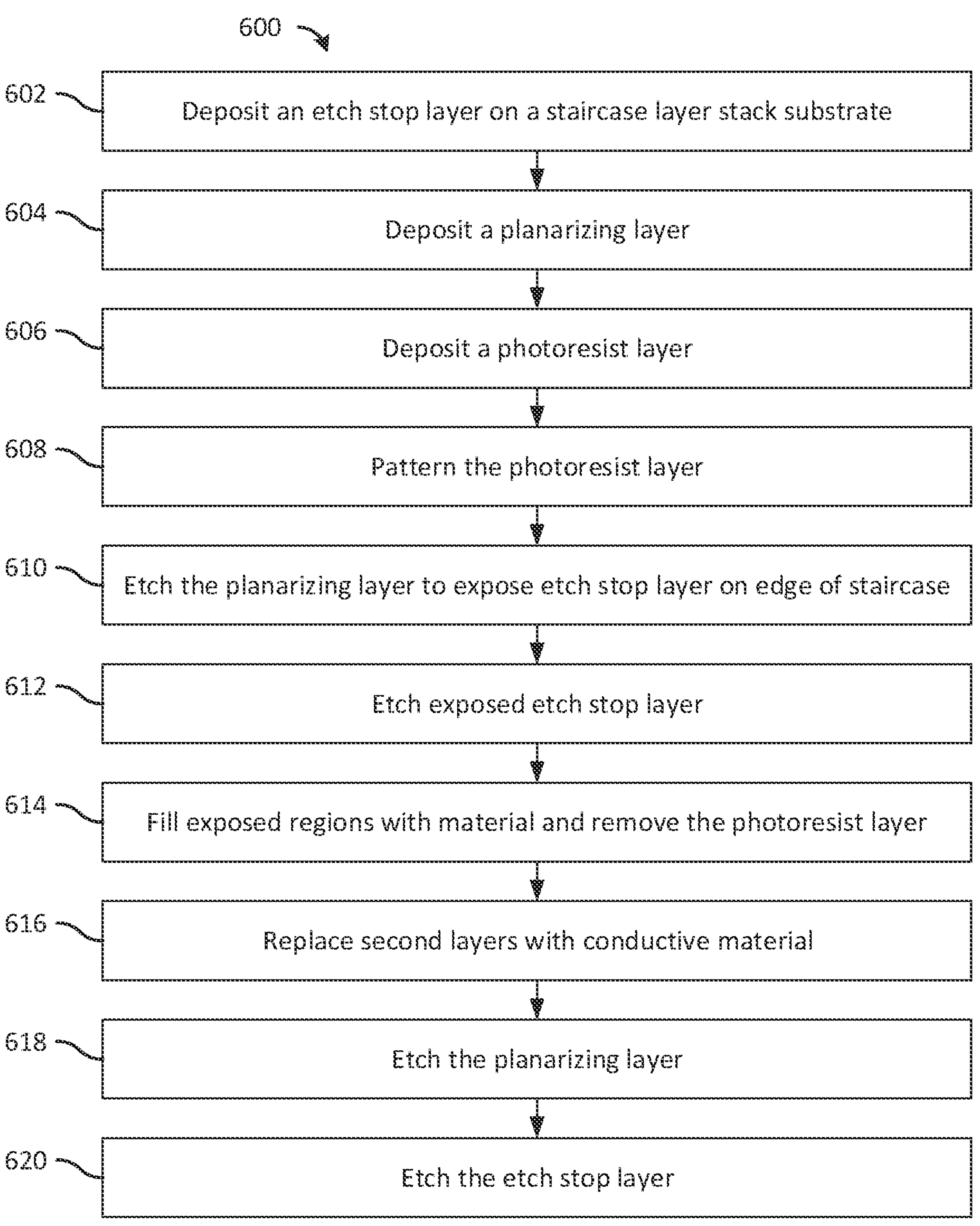
FIG. 6 is a flowchart illustrating a substrate processing method according to an embodiment.

Another method for processing a substrate to form contacts using an etch stop layer is described using the flowchart of FIG. 6. The embodiment method of FIG. 6 is illustrated in the cross-sectional view schematic diagrams of FIGS. 7A-7D. The embodiment method of FIG. 6 is also illustrated in the aerial view schematic diagrams of FIGS. 8A-8C. The embodiment method of FIG. 6 is further illustrated in the cross-sectional view schematic diagrams of FIGS. 9A-9C and the aerial view schematic diagram of FIG. 10.

Figure 11:
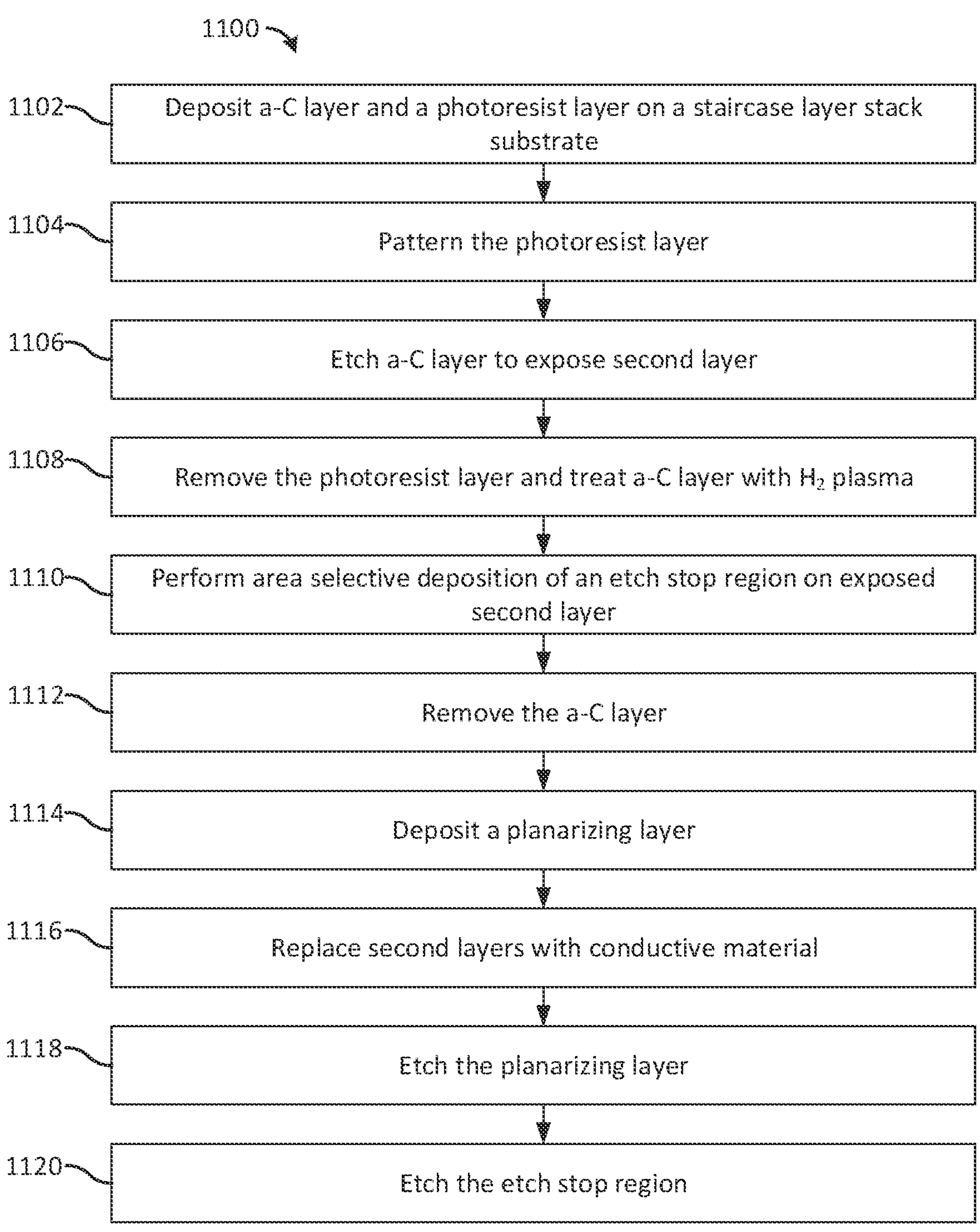
FIG. 11 is a flowchart illustrating a substrate processing method according to an embodiment.

And another method for processing a substrate to form contacts using an etch stop layer deposited by atomic layer deposition (ALD) after a $H_2$ plasma treatment of an etched amorphous carbon (a-C) layer is described using the flowchart of FIG. 11. The embodiment method of FIG. 11 is illustrated in the cross-sectional view schematic diagrams of FIGS. 12A-12G. And the embodiment method of FIG. 11 is also illustrated in the aerial view schematic diagrams of FIGS. 13A-13G. The embodiment method of FIG. 11 is further illustrated in the cross-sectional view schematic diagrams of FIGS. 14A-14C and the aerial view schematic diagrams of FIGS. 15A-15C.

FIG. 1 illustrates a flowchart of a method of processing a substrate using an etch stop layer and a protective layer to prevent conductive layer degradation in the fabrication of contacts. FIG. 1 illustrates a method 100 which eventually replaces a second layer with conductive material to form a conductive layer.

Referring to FIG. 1, the method 100 may begin in a box 102. In box 102, an etch stop layer is deposited on a staircase layer stack substrate. The deposition process may be an atomic layer deposition (ALD) process. The staircase layer stack substrate may comprise a substrate with a layer stack of a first layer and a second layer repeatedly stacked and subsequently etched to form a staircase layer stack on the substrate. For example, the staircase layer stack substrate may be the staircase layer stack substrate illustrated in the cross-sectional view schematic diagram of FIG. 2A and the aerial view schematic diagram of FIG. 3A.

Figures 2A, 2B, 3A, 3B:
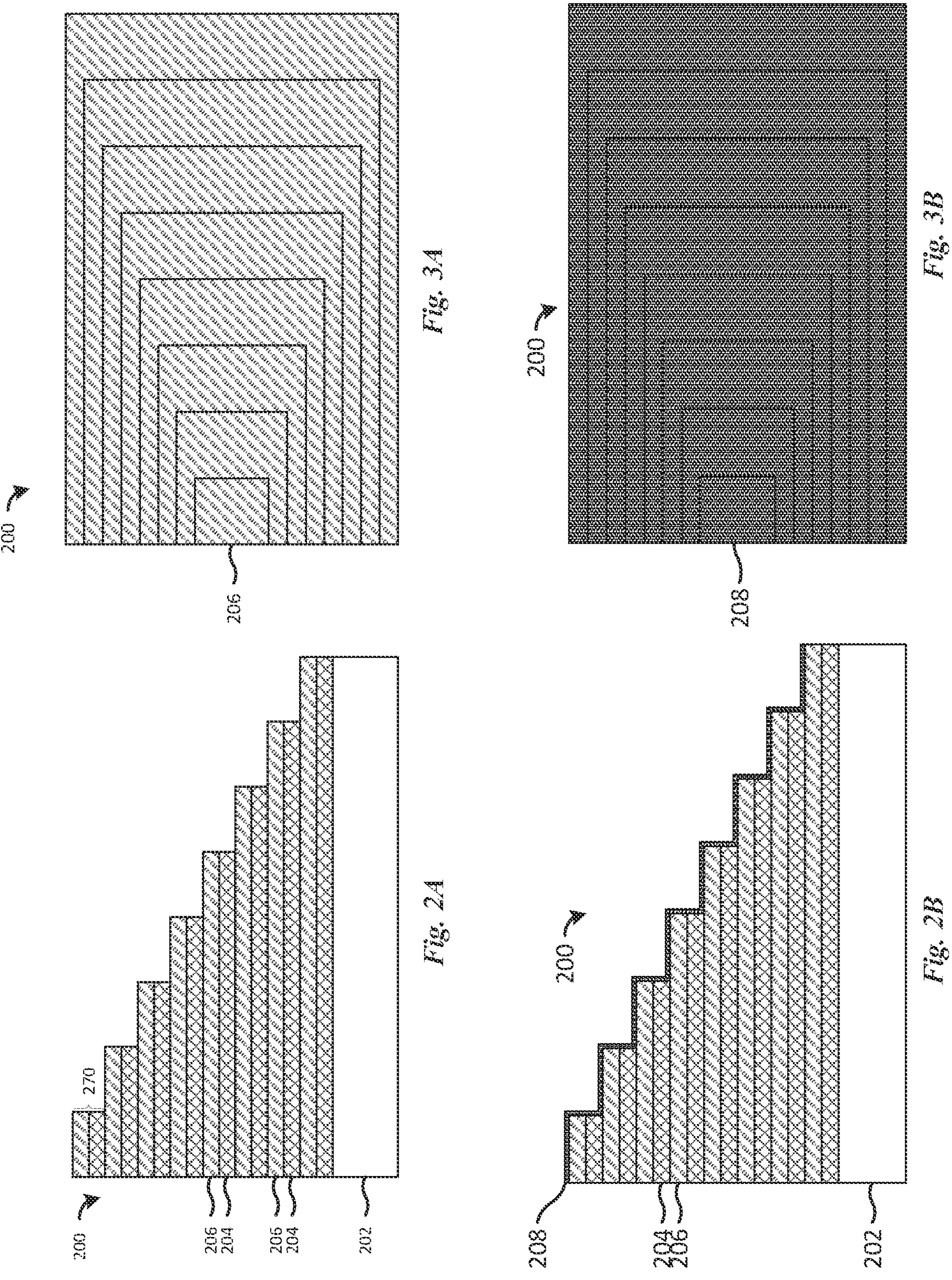
FIGS. 2A-2G are schematic diagrams in a cross-sectional view illustrating a substrate processing method of FIG. 1 according to an embodiment.
FIGS. 3A-3F are schematic diagrams in an aerial view illustrating a substrate processing method corresponding to FIGS. 2A-2G according to an embodiment.

FIG. 2A illustrates a cross-sectional view schematic diagram of a staircase layer stack substrate 200. In an embodiment, the staircase layer stack substrate 200 may be used in the method 100 of FIG. 1. The staircase layer stack substrate 200 comprises a substrate 202 with alternating layers of a first layer 204 and a second layer 206 that have been stacked and subsequently etched to form the steps of the staircase layer stack substrate 200. Each step of the staircase layer stack substrate 200 has a sidewall 270 which extends from one step to another step of the staircase layer stack substrate 200. FIG. 3A illustrates an aerial view schematic diagram of the staircase layer stack substrate 200.

In various embodiments, the substrate 202 is a semiconductor substrate. The substrate 202 may be a silicon wafer, e.g., a 200 mm wafer, a 300 mm wafer, or a 450 mm wafer, including wafers having one or more layers of material, such as dielectric, conducting, or semi-conducting material deposited thereon. The layer stack of steps of the alternating first layer 204 and second layer 206 may include between 48 and 512 layers, where each of either the first layer or the second layer is one layer. Each step of the staircase layer stack substrate comprises a first layer and second layer pair, where the number of steps may include between 24 and 256 steps.

In similar embodiments, the first layer 204 and the second layer 206 are alternating oxide and nitride films that have been etched to form the steps of the staircase layer stack substrate 200. In various embodiments, the first layer 204 is an oxide film, e.g., comprising silicon. In various embodiments, the second layer 206 is a nitride film, e.g., comprising silicon. In one or more embodiments, the thickness of the first layer 204 and the thickness of the second layer 206 are about the same, e.g., the thickness of the first layer 204 and the thickness of the second layer 206 may be between about 10 nm and about 100 nm. In other embodiments, the first layer 204 is a nitride film, e.g., comprising silicon, and the second layer 206 is an oxide film, e.g., comprising silicon.

FIGS. 2B and 3B illustrate a cross-sectional view and an aerial view schematic diagram of the staircase layer stack substrate 200 after an etch stop layer 208 has been deposited over the steps of the staircase layer stack substrate 200. FIG. 2B illustrates the cross-sectional view schematic diagram after box 102 of method 100 in FIG. 1. FIG. 3B illustrates the aerial view of the staircase layer stack substrate 200 after box 102 of method 100 in FIG. 1. In various embodiments, the etch stop layer 208 may be deposited using a deposition process such as an atomic layer deposition (ALD) process, and may be a TiN of a thickness between about 5 nm and about 10 nm.

In various embodiments, the etch stop layer 208 is of a material that is selective to the materials of any planarizing layer deposited above the etch stop layer 208 as well as the first layer 204 and second layer 206 beneath. As a result of using a material in the etch stop layer 208 that is selective to the materials of any planarizing layers and the first layer 204 and the second layer 206, when the planarizing layer is etched, the etch stop layer 208 will be etched at a slower rate than the material of the planarizing layer. Another result is that after etching through the etch stop layer 208, the uppermost second layer 206 (or uppermost first layer 204 in some embodiments) may be etched at a slower rate than the etch stop layer 208. The etch stop layer 208 may be any suitable material with good selectivity over oxide or nitride films, or good selectivity over any other materials the first layer 204 and second layer 206 may comprise. As a result, the etch stop layer 208 is also able to be wet or dry etched using various chemistries selective to the layers of the staircase layer stack substrate 200. In various embodiments, the etch stop layer 208 is TiN.

Figures 2C, 2D, 3C, 3D:
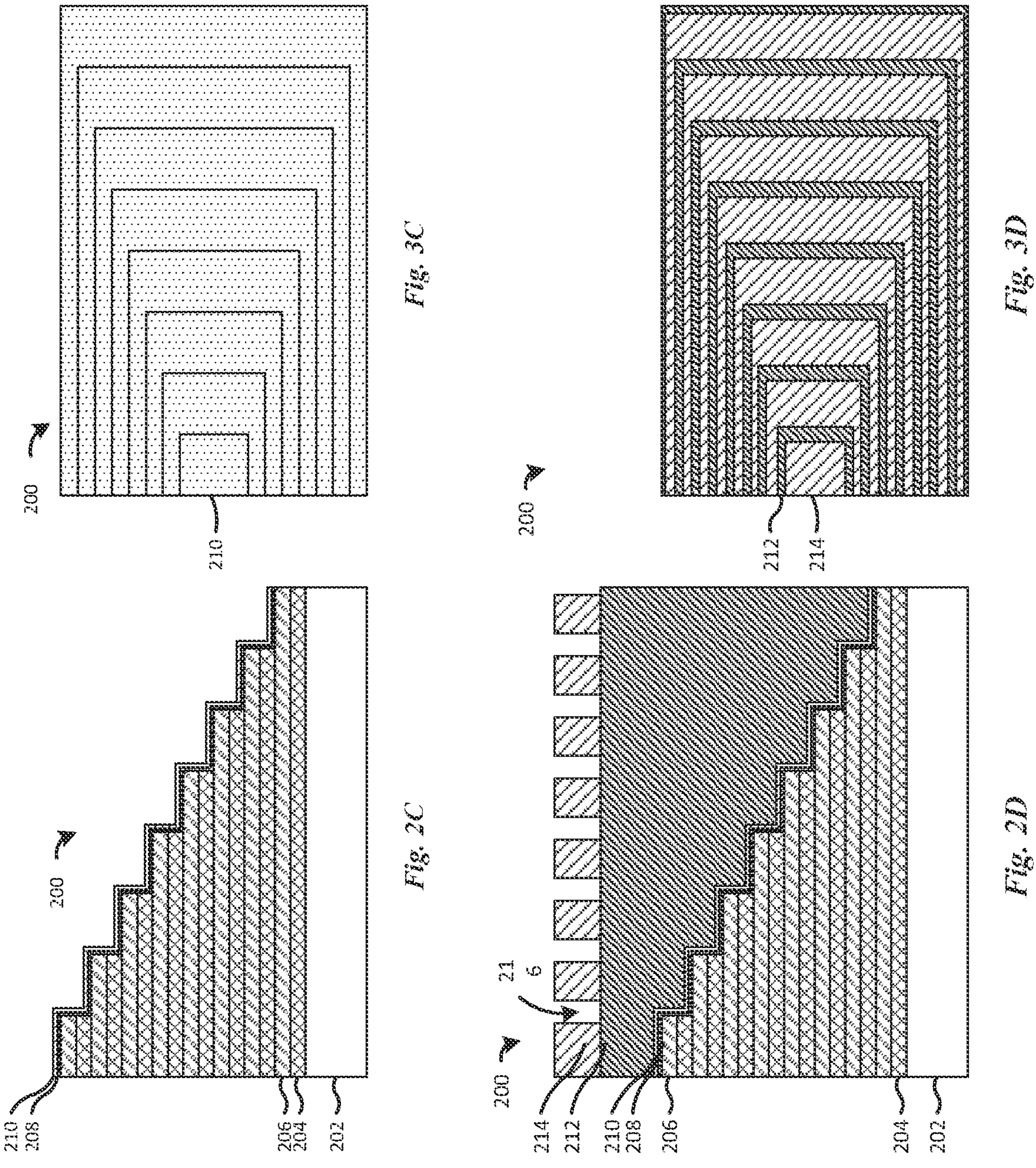

After depositing the etch stop layer, the method 100 proceeds to box 104. In box 104, a protective layer is deposited on the etch stop layer. For example, FIGS. 2C and 3C illustrate a cross-sectional view and an aerial view schematic diagram of the staircase layer stack substrate 200 after a protective layer 210 has been deposited over the etch stop layer 208 in box 104. In various embodiments, the protective layer 210 is deposited through an ALD process with a thickness between about 5 nm and about 10 nm. The protective layer 210 may be an oxide layer, or other suitable material.

After depositing the protective layer in box 104, the method 100 proceeds to box 106. In box 106, the method 100 deposits a planarizing layer to planarize the semiconductor device being fabricated in preparation for a photolithography process. FIGS. 2D and 3D illustrate a cross-sectional view and an aerial view schematic diagram of the staircase layer stack substrate 200 after a planarizing layer 212 has been deposited over the protective layer 210 in box 104. In various embodiments, the planarizing layer 212 is amorphous-carbon (a-C).

After depositing the planarizing layer, the method 100 proceeds to box 108 where the method 100 deposits a photoresist layer on the planarizing layer. FIGS. 2D and 3D illustrate a cross-sectional view and an aerial view schematic diagram of the staircase layer stack substrate 200 after a photoresist layer 214 has been deposited over the planarizing layer 212 in box 108 of FIG. 1. In box 110, the method 100 patterns the photoresist layer according to a feature pattern to be used to etch the protective layer and the etch stop layer on the edges of the steps of the staircase layer stack substrate, which is illustrated in the cross-sectional view and aerial view schematic diagrams of FIGS. 2D and 3D. A feature 216 is illustrated in FIG. 2D where the photoresist layer 214 has been patterned for etching the layers at the edges of the steps of the staircase layer stack substrate 200. In various embodiments, the feature 216 is a via. In other embodiments, the feature 216 may be a vertical slit.

Figures 2E, 2F, 3E, 3F:
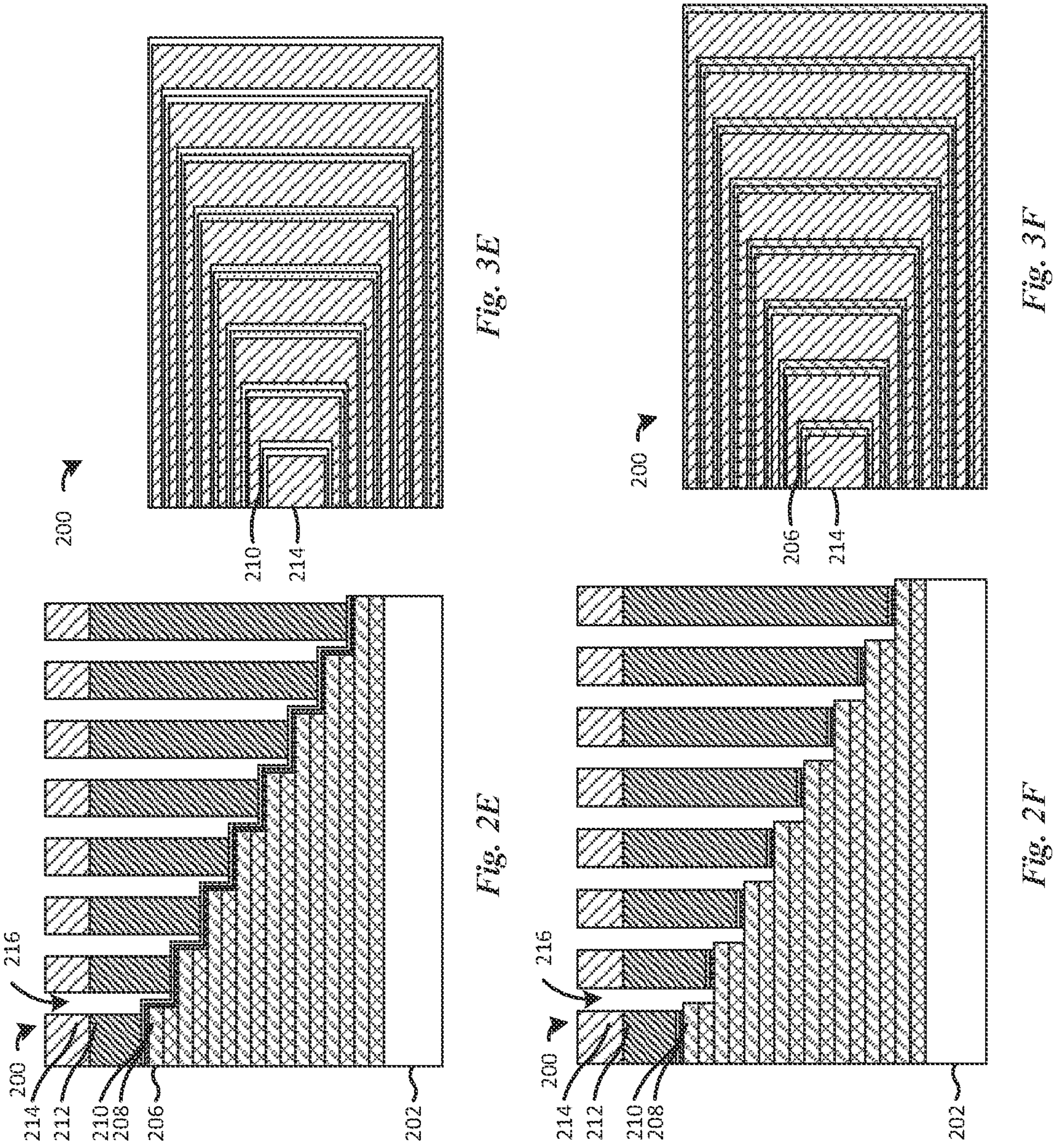

Referring to FIG. 1, in box 112, the method 100 etches the planarizing layer to expose the protective layer on the edges of the steps of the staircase layer stack substrate. The etching of the planarizing layer may be done by any method appropriate for etching the material of the planarizing layer. For example, different etch recipes may use different gases to form a plasma which may be used for etching. In an embodiment where the planarizing layer is a-C, the gas used to form a plasma for etching may be an O2 and/or N2 containing gas which has a high selectivity over the protective layer and the etch stop layer. FIGS. 2E and 3E illustrate cross-sectional view and aerial view schematic diagrams of the staircase layer stack substrate 200 after etching the planarizing layer 212 to expose the protective layer 210 at the edges of the steps, such as in box 112 of FIG. 1.

After etching the planarizing layer, the method 100 etches the now exposed protective layer and the etch stop layer beneath in box 114. The etching of the protective layer and the etch stop layer may comprise different etch processes in an embodiment. In another embodiment, the protective layer and the etch stop layer may be etched using the same etch process. For example, the protective layer and etch stop layer may be etched using a plasma etch process. In various embodiments, the protective layer and etch stop layer may be etched using dry-etch processes. In an embodiment where the etch stop layer is TiN and the protective layer is an oxide layer, the protective layer may be etched using a fluorocarbon gas plasma etch (where the fluorocarbon gas is of the form $C_xF_y$) and the etch stop layer may be etched using a $Cl_2$/Ar gas mixture plasma etch.

The etching of the etch stop layer at the edges of the steps of the staircase layer stack substrate forms islands of the etch stop layer to prevent shorts from occurring between the contacts to be formed. If the etch stop layer at the edges were to remain, the material of the etch stop layer may cause an electrical connection to form between the contacts of the steps of the staircase layer stack substrate in the forming of the semiconductor device, which is not desirable and could lead to faulty devices. The material removed at the edge of the steps of the staircase layer stack substrate is smaller than the total width of a step and leaves the majority of each step covered by the etch stop layer. For example, in an embodiment, the width of a step of the staircase layer stack substrate may be about 120 nm to about 150 nm, and the width of the material removed at the edge of the steps may be between about 20 nm and about 40 nm, such that a large percentage of each step is covered by the etch stop layer after removal at the edges. An example of the staircase layer stack substrate 200, after etching the protective layer 210 and the etch stop layer 208 according to the method 100 in box 114, is illustrated in the cross-sectional view and aerial view schematic diagrams of FIGS. 2F and 3F.

Once the method 100 has etched the protective layer and the etch stop layer at the edges of the steps of the staircase layer stack substrate, the method 100 proceeds to box 116. In box 116, the method 100 removes any remnants of the photoresist layer and the planarizing layer. The removal of the photoresist layer and the planarizing layer may be done by any method suitable for their removal. And after the photoresist layer and the planarizing layer are removed, the method 100 proceeds to box 118.

Figure 2G:
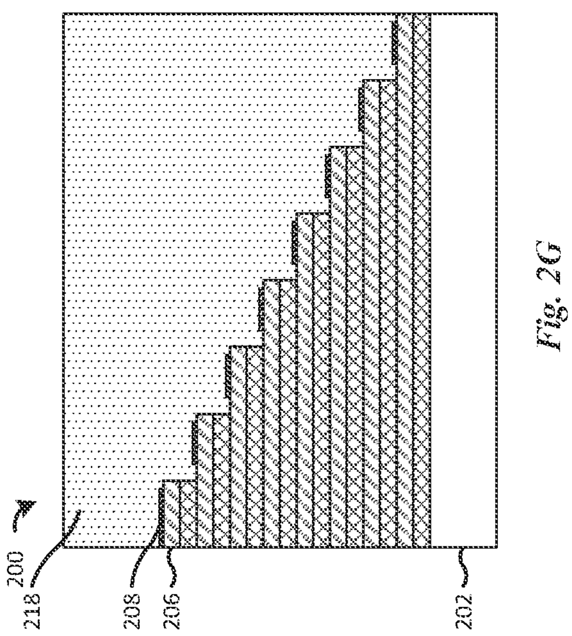

In box 118, the method 100 deposits a new planarizing layer of the same material as the protective layer. Because the new planarizing layer is of the same material as the protective layer, the protective layer is indistinguishable from the new planarizing layer such that there is just the new planarizing layer above the etch stop layer. In other embodiments, the new planarizing layer may not be the same material as the protective layer, but may be etched using the same etch process. An illustration of the staircase layer stack substrate 200 after being processed through box 116 and box 118 of the method 100 of FIG. 1 is illustrated in the schematic diagram of FIG. 2G. In FIG. 2G, a new planarizing layer 218 has been deposited over the etch stop layer 208 and the protective layer 210 such that the protective layer 210 is indistinguishable from the new planarizing layer 218. In various embodiments, the new planarizing layer 218 and the protective layer 210 may both be oxide layers.

After depositing the new planarizing layer 218 in box 118, the method 100 proceeds to box 120 in FIG. 1. In box 120, the method 100 replaces the second layers with conductive material to form conductive layers, or wordlines. The replacement of the second layers with conductive material may be performed using conventional techniques, such as by an isotropic etch process that selectively etches the material of the second layer over the material of the first layer and then deposits the conductive material (through a suitable method) in the gaps. For example, in an embodiment where the material of the first layer is silicon oxide and the material of the second layer is silicon nitride, the etch process may selectively etch silicon nitride. Further, the silicon nitride may be etched using a selective dry etch process, such as by exposing the substrate to any one or more of the following gases: chlorine ($Cl_2$), oxygen ($O_2$), nitrous oxide ($N_2O$), tetrafluoromethane ($CF_4$), sulfur tetrafluoride ($SF_4$), carbon dioxide ($CO_2$), fluoromethane ($CH_3F$), nitrogen trifluoride ($NF_3$), nitrogen ($N_2$), hydrogen ($H_2$), ammonia ($NH_3$), methane ($CH_4$), sulfur hexafluoride ($SF_6$), argon (Ar), carbonyl sulfide (COS), carbon disulfide ($CS_2$), hydrogen sulfide ($H_2S$), and nitric oxide (NO). In another embodiment, the second layers may be nitride layers and may be wet etched with $H_3PO_4$. After the isotropic etch of the second layers, a conductive material is deposited in the spaces where the second layers used to be to form a conductive layer (or wordlines) in each space. In various embodiments, the conductive layer is tungsten or heavily doped polysilicon, which may be deposited through a suitable technique, such as ALD, chemical vapor deposition (CVD), plasma enhanced ALD (PEALD), and/or plasma enhanced CVD (PECVD). In some embodiments, a barrier layer and/or a tungsten nucleation layer is deposited prior to depositing bulk tungsten.

Figures 4A, 4B, 4C, 5:
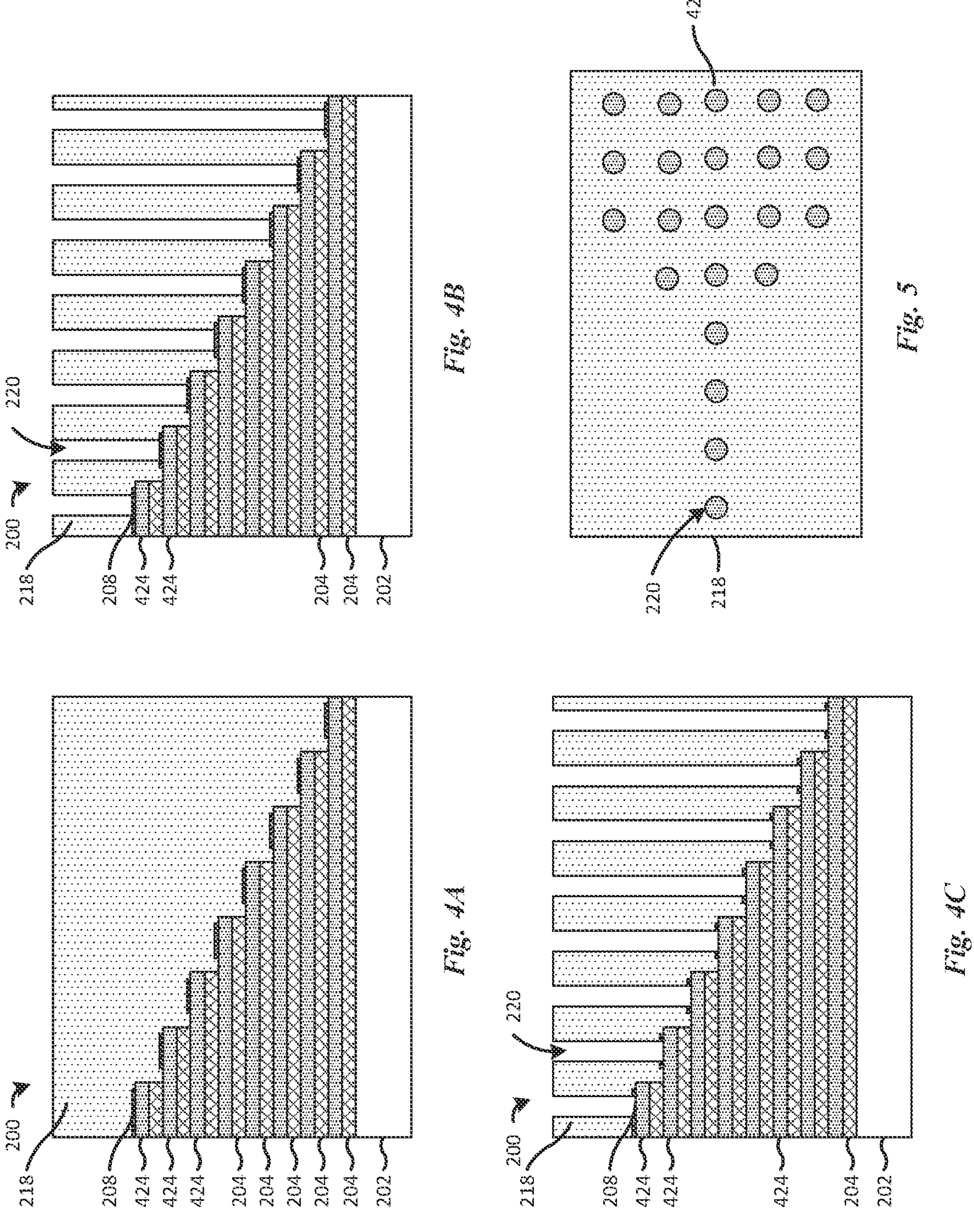
FIGS. 4A-4C are schematic diagrams in a cross-sectional view illustrating a substrate processing method of FIG. 1 according to an embodiment.
FIG. 5 is a schematic diagram in an aerial view illustrating a substrate processing method corresponding to FIG. 4C according to an embodiment.

FIG. 4A illustrates a cross-sectional view of the staircase layer stack substrate 200 after replacing each of the second layers 206 with conductive material to form a conductive layer 424 in box 120 of the method 100. As described above, the conductive layer 424 may be any suitable material deposited through any suitable process for fabricating the semiconductor device according to the process recipe, such as tungsten or polysilicon.

Referring back to FIG. 1, the method 100 then proceeds to box 122. In box 122, the method 100 performs the associated steps for vertically etching the new planarizing layer to expose the etch stop layer at the center of the steps of the staircase layer stack substrate and to form vertical vias, or channels (contacts with the conductive layers). The vertical vias may have a critical dimension between about 20 nm and about 50 nm. For example, the conventional technique would involve depositing and patterning a new photoresist layer. The patterning comprises a feature pattern for forming contacts with the conductive layers of the staircase layer stack substrate. And after patterning the new photoresist layer, etching the feature pattern to expose the etch stop layer. For example, in an embodiment where the new planarizing layer is an oxide layer, the oxide may be etched by dry etching using exposure to one or more of the following gases: O2, Ar, C4F6, C4F8, SF6, CHF3, and CF4. Other embodiments may also comprise masking steps.

FIG. 4B illustrates the staircase layer stack substrate 200 after etching the new planarizing layer 218 to expose the etch stop layer 208 and start to form a contact feature 220 on each step as described in box 122 of method 100 in FIG. 1. The contact feature 220 may have a critical dimension between about 10 nm and about 50 nm. As a result of using the etch stop layer 208, the method 100 may simultaneously etch the vias to form the contact features for all steps of the staircase layer stack substrate 200 without over-etching the conductive layer 424, because the etching process of box 122 is not selective (etches the material of the new planarizing material at a higher etch rate) to the material of the etch stop layer 208. In various embodiments, more than one contact feature 220 may be etched within each layer of the staircase structure as the contact landing area increases progressively from left to right, such as is illustrated in FIG. 5.

After exposing the etch stop layer, the method 100 proceeds to box 124. In box 124, the method 100 etches the exposed etch stop layer to form contact features to be connected to the conductive layer. The etch process uses an etch recipe to selectively etch the material of the etch stop layer over the uppermost second layer. For example, in an embodiment where the etch stop layer is TiN, the etch stop layer may be etched using a plasma formed from a gas comprising a $Cl_2$/Ar mixture. FIGS. 4C and 5 illustrate a cross-sectional view and an aerial view schematic diagram of the staircase layer stack substrate 200 after etching through the etch stop layer 208 to expose the upper conductive layer 424 and form a contact feature 220 of box 124 of the method 100.

In various embodiments, after box 124 of the method 100 in FIG. 1, the contact feature 220 of FIG. 4C may be filled with a conductive material to finish forming the multilevel contacts of the semiconductor device. For example, using a damascene process, copper may be filled into each of contact features 220 simultaneously. In another embodiment, the contact features 220 may be filled with a metal such as tungsten using deposition processes. In certain embodiments, an adhesion layer and diffusion barrier layer may be deposited prior to the conductive filling. The contact features 220 may be over filled so as to have an upper surface above the deepest one of the contact features 220. The overfilled surface may then be planarized, for example, using chemical mechanical processing. Subsequent processing may follow standard semiconductor process flow.

FIG. 5 also recognizes that more number of contacts may be formed in some regions based on the metallization and routing for each specific design.

Included in the benefits of the method 100, in comparison to conventional techniques for forming contacts, are that the method 100 may etch all of the contact features simultaneously without over-etching the conductive layers, and that the total number of patterning steps for fabricating contacts of a semiconductor device are reduced, which significantly reduces production costs.

The method 100 of FIG. 1 describes using an etch stop layer and a protective layer in the process of forming contacts on a staircase layer stack substrate. Other methods of incorporating an etch stop layer in the forming of contacts may be used, as well, such as the method 600 illustrated in FIG. 6 and described below.

Specifically, FIG. 6 describes an embodiment substrate processing method. In contrast to FIG. 1, in the embodiment of FIG. 6, the protective layer and the planarizing layer may be integrated as a homogenous planarizing layer having a material chosen to be both protective and having the ability to be planarized. Advantageously, this embodiment may be simpler in complexity by avoiding the deposition of one of the layers, e.g., a separate protective layer.

FIG. 6 illustrates a flowchart of a method of processing a substrate using an etch stop layer to prevent conductive layer degradation in the fabrication of contacts. FIG. 6 illustrates a method 600 which eventually replaces a second layer with conductive material to form a conductive layer.

Referring to FIG. 6, the method 600 may begin in a box 602. In box 602, an etch stop layer is deposited on a staircase layer stack substrate. The deposition process may be an atomic layer deposition (ALD) process, or other suitable deposition process known in the art, such as CVD, PECVD, PVD, and etcetera. The staircase layer stack substrate may comprise a substrate with a layer stack of a first layer and a second layer repeatedly stacked and subsequently etched to form a staircase layer stack on the substrate. For example, the staircase layer stack substrate may be the staircase layer stack substrate illustrated in the cross-sectional view schematic diagram of FIG. 2A and the aerial view schematic diagram of FIG. 3A.

The embodiments of the staircase layer stack substrate 200 and the materials described above in the detailed description of FIG. 2A may also be used for the substrate 202, the first layer 204, and the second layer 206 illustrated in FIGS. 7A-7D, FIGS. 8A-8C, FIGS. 9A-9C, and FIG. 10. FIGS. 2B and 3B illustrate a cross-sectional view and an aerial view schematic diagram of the staircase layer stack substrate 200 after the etch stop layer 208 has been deposited over the steps of the staircase layer stack substrate 200. FIGS. 2B and 3B illustrate the staircase layer stack substrate after box 602 of method 600 in FIG. 6. The detailed description of the materials and embodiments described above for FIGS. 2B and 3B may also be used for box 602 of method 600 in FIG. 6.

Figures 7A, 7B, 8A, 8B:
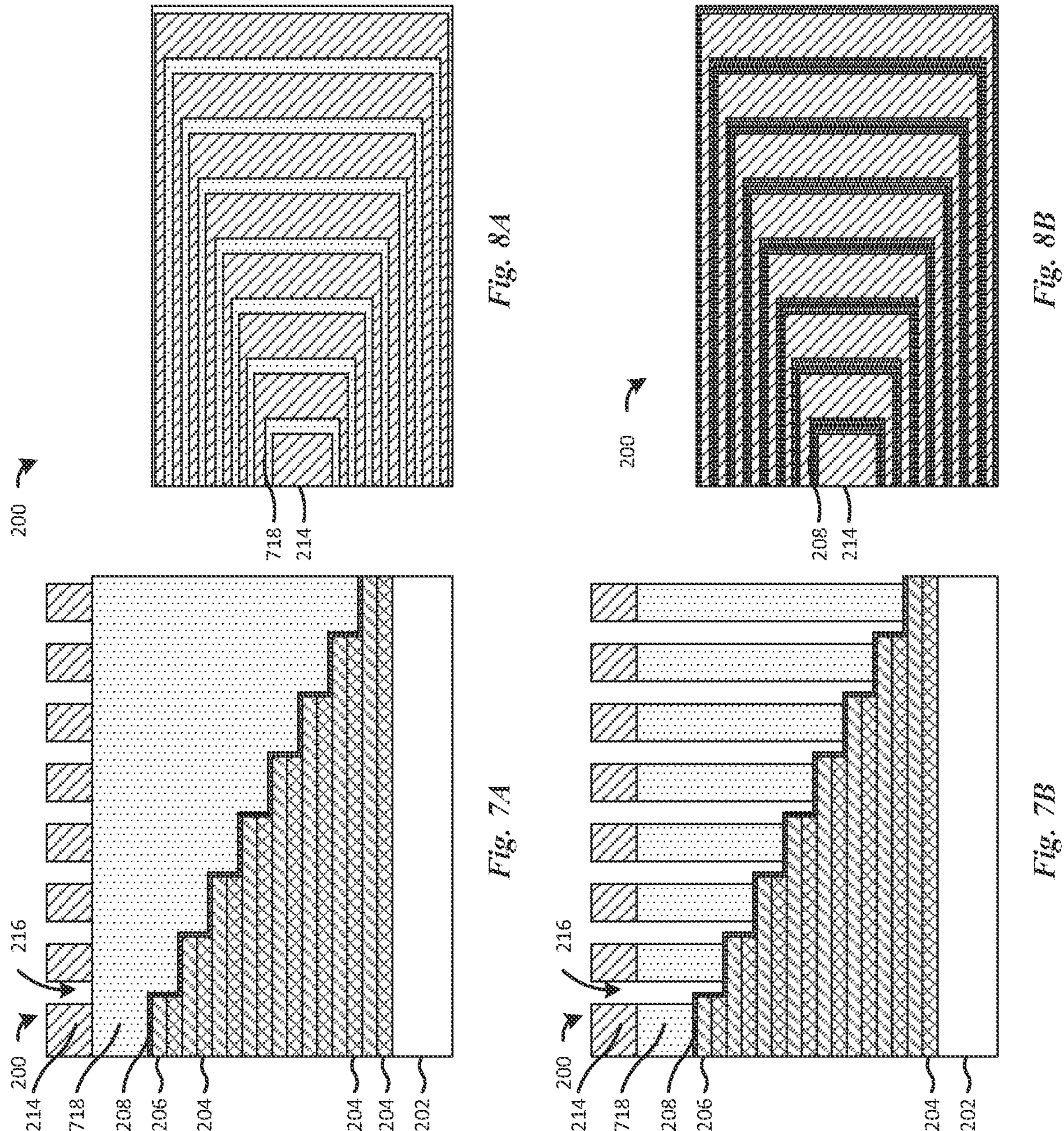
FIGS. 7A-7D are schematic diagrams in a cross-sectional view illustrating a substrate processing method of FIG. 6 according to an embodiment.
FIGS. 8A-8C are schematic diagrams in an aerial view illustrating a substrate processing method corresponding to FIGS. 7A-7D according to an embodiment.
Figures 7C, 7D, 8C:
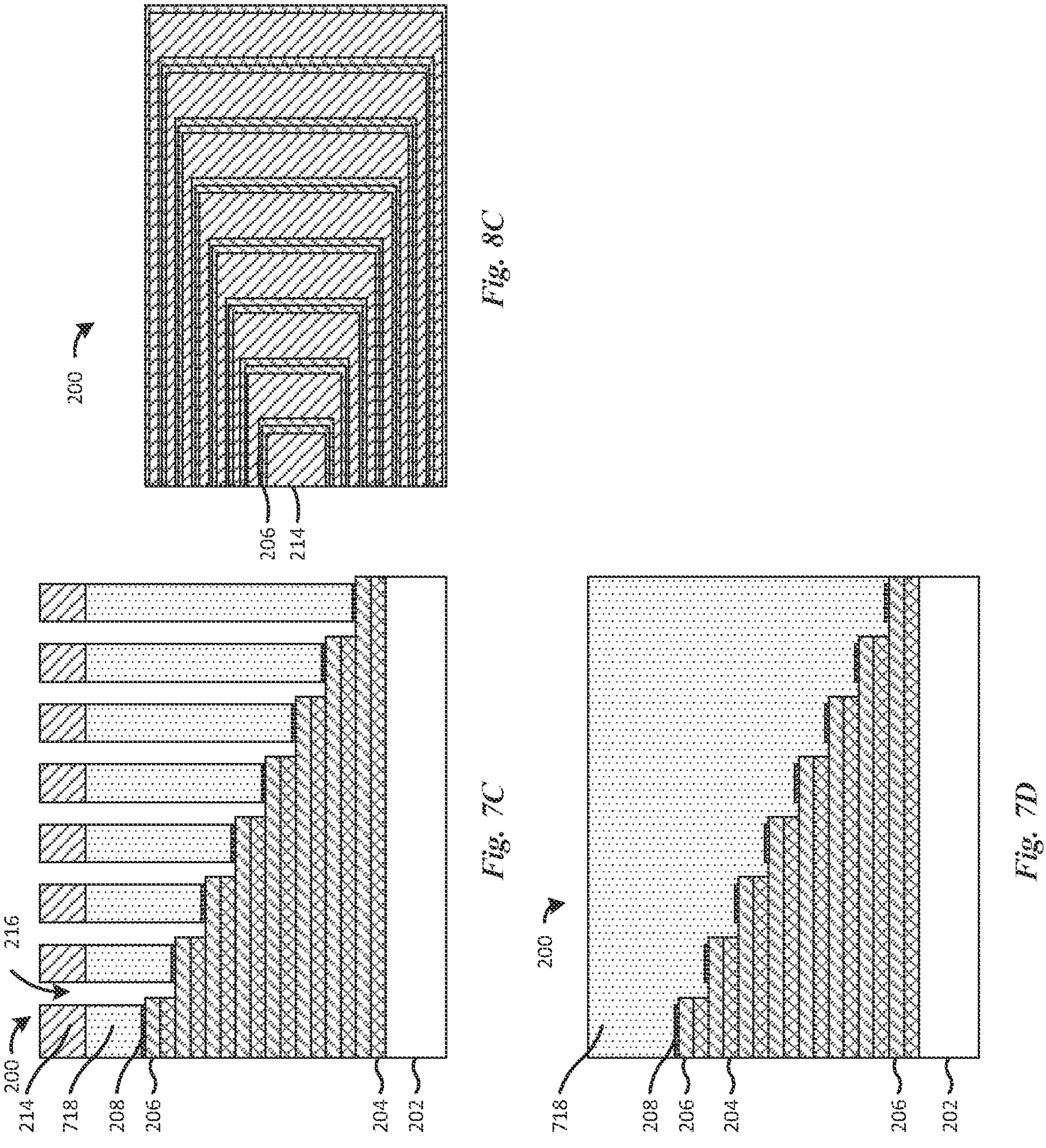

After depositing the etch stop layer, the method 600 proceeds to box 604. In box 604, a planarizing layer is deposited on the etch stop layer. For example, FIGS. 7A and 8A illustrate a cross-sectional view and an aerial view schematic diagram of the staircase layer stack substrate 200 after a planarizing layer 718 has been deposited over the etch stop layer 208 in box 604. In various embodiments, the planarizing layer 718 is deposited through any appropriate deposition process for the material of the planarizing layer 718. The planarizing layer 718 may be an oxide layer, or other suitable material. In various embodiments, the planarizing layer 718 also protects the underlying etch stop layer 208 during further processing, for example, from being oxidized.

And after depositing the planarizing layer in box 604, the method 600 proceeds to box 606. In box 606, the method 600 deposits a photoresist layer on the planarizing layer. FIGS. 7A and 8A illustrate a cross-sectional view and an aerial view schematic diagram of the staircase layer stack substrate 200 after a photoresist layer 214 has been deposited over the planarizing layer 718 in box 606 of FIG. 6. In box 608, the method 600 patterns the photoresist layer according to a feature pattern to etch the etch stop layer on the edges of the steps of the staircase layer stack substrate, which is illustrated in the cross-sectional view and aerial view schematic diagrams of FIGS. 7A and 8A. The feature 216 is illustrated in FIG. 7A where the photoresist layer 214 has been patterned for etching the etch stop layer 208 at the edges of the steps of the staircase layer stack substrate 200.

Referring to FIG. 6, in box 610, the method 600 etches the planarizing layer to expose the etch stop layer on the edges of the steps of the staircase layer stack substrate. The etching of the planarizing layer may be done by any method appropriate for etching the material of the planarizing layer. For example, different etch recipes may use different gases to form a plasma which may be used for etching (other wet etch or dry etch processes may be used in other embodiments). FIGS. 7B and 8B illustrate cross-sectional view and aerial view schematic diagrams of the staircase layer stack substrate 200 after etching the planarizing layer 718 to expose the etch stop layer 208 at the edges of the steps, such as in box 610 of FIG. 6.

After etching the planarizing layer, the method 600 etches the now exposed etch stop layer beneath in box 612. The etching of the etch stop layer uses a different etch recipe than the etch recipe used to etch the planarizing layer. The etching of the etch stop layer at the edges of the steps of the staircase layer stack substrate forms islands of the etch stop layer to prevent shorts from occurring between the contacts to be formed. If the etch stop layer at the edges were to remain, the material of the etch stop layer may cause an electrical connection to form between the contacts of the steps of the staircase layer stack substrate in the forming of the semiconductor device, which is not desirable and could lead to faulty devices. The material removed at the edge of the steps of the staircase layer stack substrate is smaller than the total width of a step and leaves the majority of each step covered by the etch stop layer. For example, in an embodiment, the width of a step of the staircase layer stack substrate may be about 120 nm to about 150 nm, and the width of the material removed at the edge of the steps may be between about 20 nm and about 40 nm, such that a large percentage of each step is covered by the etch stop layer after removal at the edges. An example of the staircase layer stack substrate 200 after etching the etch stop layer 208 according to the method 600 in box 612 is illustrated in the cross-sectional view and aerial view schematic diagrams of FIGS. 7C and 8C.

Once the method 600 has etched the etch stop layer at the edges of the steps of the staircase layer stack substrate, the method 600 proceeds to box 614. In box 614, the method 600 removes any remnants of the photoresist layer and restores the planarizing layer by filling the features formed to etch the etch stop layer at the edges of the steps of the staircase layer stack substrate with the same material as the planarizing layer. For example, if the planarizing layer is an oxide material, the vias etched to remove the etch stop layer at the edges of the steps may be filled with the same oxide material by the same deposition method used to deposit the planarizing layer. The removal of the photoresist layer may be accomplished by any method suitable for the removal of the material. The restoring of the planarizing layer may be accomplished by any suitable deposition process capable of filling the etched features at the edges of the steps of the staircase layer stack substrate. An example of the staircase layer stack substrate 200 after removing remaining photoresist layer 214 and restoring the planarizing layer 718 is illustrated in the cross-sectional view schematic diagram of FIG. 7D. In other embodiments, rather than restoring the planarizing layer, the planarizing layer is also removed, and a new planarizing layer may be deposited using an appropriate method for the material of the new planarizing layer.

After the photoresist layer is removed and the planarizing layer is restored, the method 600 proceeds to box 616 in FIG. 6. In box 616, the method 600 replaces the second layers with conductive material to form conductive layers. The replacement of the second layers with conductive material may be performed using conventional techniques, such as by an isotropic etch process that selectively etches the material of the second layer over the material of the first layer. For example, in an embodiment where the material of the first layer is silicon oxide and the material of the second layer is silicon nitride, the etch process may selectively etch silicon nitride. In another embodiment, the second layers may be nitride layers and may be wet etched with $H_3PO_4$. After the isotropic etch of the second layers, a conductive material is deposited in the spaces where the second layers used to be to form a conductive layer in each space. In various embodiments, the conductive layer is tungsten, which may be deposited through a suitable technique, such as ALD, CVD, PEALD, and/or PECVD. In some embodiments, a barrier layer and/or a tungsten nucleation layer is deposited prior to depositing bulk tungsten.

Figures 9A, 9B, 9C, 10:
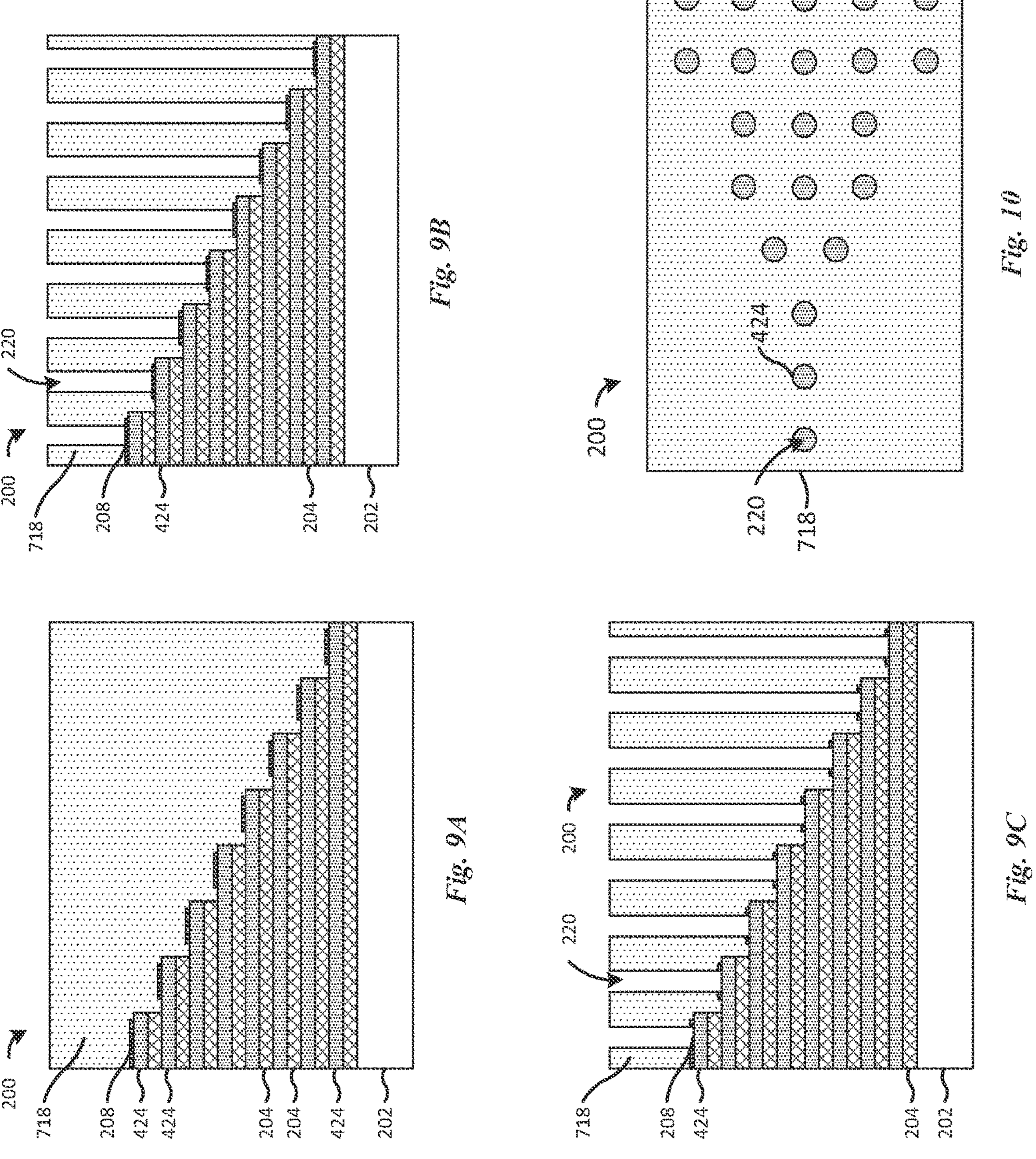
FIGS. 9A-9C are schematic diagrams in a cross-sectional view illustrating a substrate processing method of FIG. 6 according to an embodiment.
FIG. 10 is a schematic diagram in an aerial view illustrating a substrate processing method corresponding to FIG. 9C according to an embodiment.

FIG. 9A illustrates a cross-sectional view of the staircase layer stack substrate 200 after replacing each of the second layers 206 with conductive material to form a conductive layer 424 in box 616 of the method 600. The conductive layer 424 may be any suitable material deposited through any suitable process for fabricating the semiconductor device according to the process recipe, such as tungsten.

After replacing the second layers with conductive material, the method 600 proceeds to box 618. In box 618, the method 600 etches the restored planarizing layer using an appropriate technique to reveal the etch stop layer at the center of the steps of the staircase layer stack substrate and to start forming the contact features. For example, the conventional technique would involve depositing and patterning a new photoresist layer. The patterning comprises a feature pattern for forming contacts with the conductive layers of the staircase layer stack substrate. And after patterning the new photoresist layer, etching the feature pattern to expose the etch stop layer. Other embodiments may also comprise masking steps.

FIG. 9B illustrates the staircase layer stack substrate 200 after etching the planarizing layer 718 to expose the etch stop layer 208 and start to form a contact feature 220 on each step as described in box 618 of method 600 in FIG. 6. As a result of using the etch stop layer 208, the method 600 may simultaneously etch the contact features for all steps of the staircase layer stack substrate 200 without over-etching the conductive layer 424, because the etching process of box 618 is not selective to the material of the etch stop layer 208.

And referring back to FIG. 6, in box 620, the method 600 etches the etch stop layer to finish forming the contact feature on each step. The contact feature may have a critical dimension between about 50 nm and about 500 nm. Because each step has an etch stop layer of the same thickness, etching through the etch stop layer may be performed simultaneously, and the etching of the etch stop layer does not over-etch the contact feature into the conductive layer. FIGS. 9C and 10 illustrate the staircase layer stack substrate 200 after etching the etch stop layer 208 through to the conductive layer 424 according to box 620 of the method 600 in FIG. 6.

In various embodiments, after box 620 of the method 600 in FIG. 6, the contact feature 220 of FIG. 9C may be filled with a conductive material to finish forming the contacts of the semiconductor device. The process of filling the contact features 220 with a conductive material to finish forming the contacts of the semiconductor device may be as previously described for method 100 of FIG. 1. Included in the benefits of the method 600, in comparison to conventional techniques for forming contacts, are that the method 600 may etch all of the contact features simultaneously without over-etching the conductive layers, and that the total number of steps for fabricating contacts of a semiconductor device are reduced.

The method 600 of FIG. 6 describes using an etch stop layer in the process of forming contacts on a staircase layer stack substrate. Other methods of incorporating an etch stop layer in the forming of contacts may be used, as well, such as the method 1100 illustrated in FIG. 11 and described below.

FIG. 11 illustrates a flowchart of an embodiment method of processing a substrate using an etch stop layer deposited using a selective deposition process to prevent conductive layer degradation during the fabrication of contacts. In this embodiment, and unlike the prior embodiments, the method uses an area selective deposition of an etch stop layer within the contact opening greatly simplifying the process. Similar to FIGS. 1 and 6, FIG. 11 illustrates a method 1100 which eventually replaces a second layer with conductive material to form a conductive layer.

Referring to FIG. 11, the method 1100 may begin in a box 1102. In box 1102, an amorphous-carbon (a-C) layer and a photoresist layer are deposited on a staircase layer stack substrate 200. The photoresist layer is planarized over the staircase layer stack substrate.

Figures 12A, 12B, 13A, 13B:
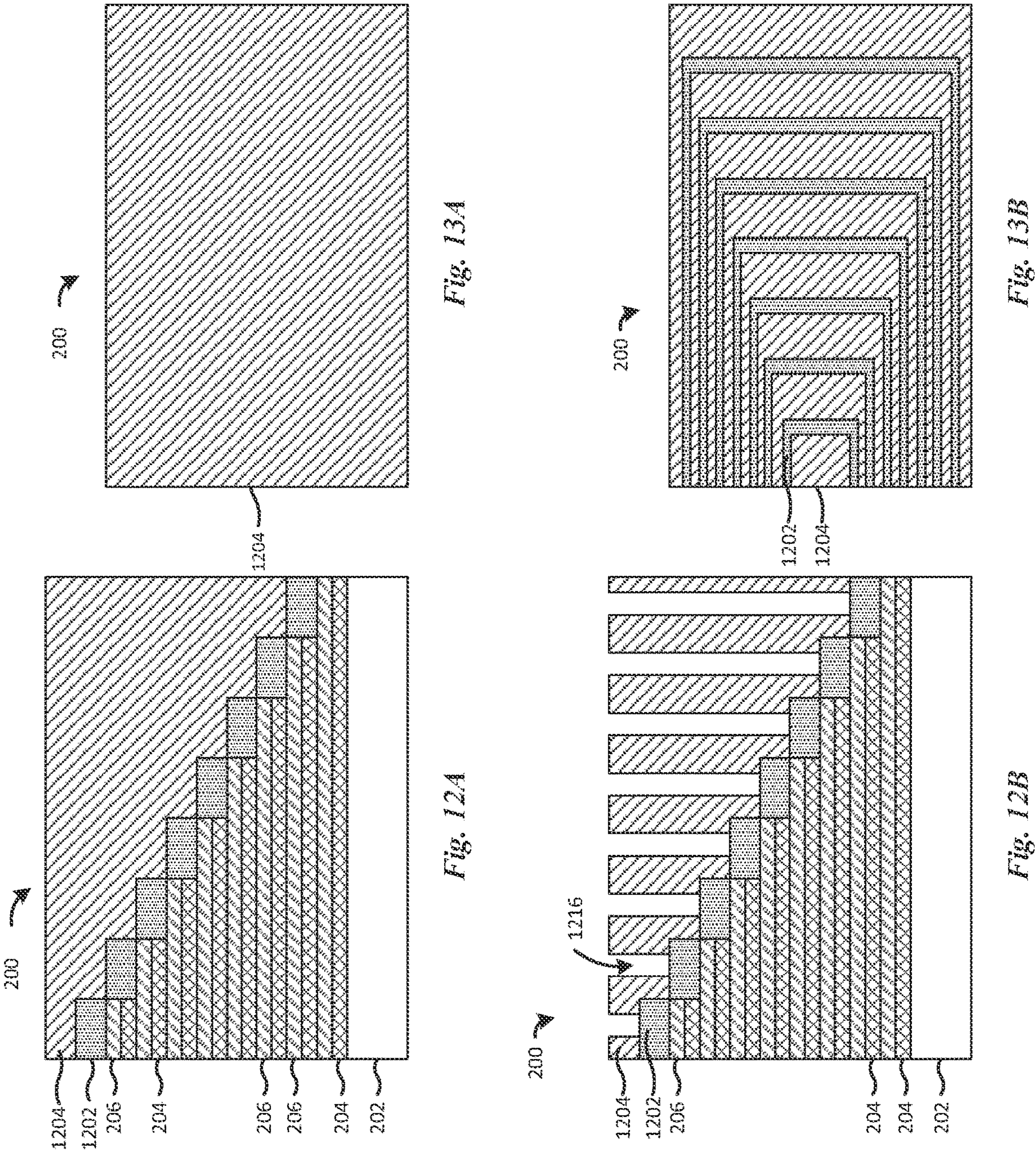
FIGS. 12A-12G are schematic diagrams in a cross-sectional view illustrating a substrate processing method of FIG. 11 according to an embodiment.
FIGS. 13A-13G are schematic diagrams in an aerial view illustrating a substrate processing method corresponding to FIGS. 12A-12G according to an embodiment.

The embodiments of the staircase layer stack substrate 200 and the materials described above in the detailed description of FIG. 2A may also be used for the substrate 202, the first layer 204, and the second layer 206 illustrated in FIGS. 12A and 13A.

FIGS. 12A and 13A illustrate a cross-sectional view and an aerial view schematic diagram of the staircase layer stack substrate 200 after an a-C layer 1202 and a photoresist layer 1204 that planarizes the staircase layer stack substrate 200 have been deposited over the steps of the staircase layer stack substrate 200.

FIG. 12A illustrates the cross-sectional view schematic diagram after box 1102 of method 1100 in FIG. 11. FIG. 13A illustrates the aerial view of the staircase layer stack substrate 200 after box 1102 of method 1100 in FIG. 11.

In various embodiments, the a-C layer 1202 may be deposited as a conformal layer along the sidewalls of the staircase structure. Because of the conformal deposition process, the a-C layers on top of each step of the staircase structure are the same thickness. The a-C layer 1202 may be deposited using any suitable method and the a-C layer 1202 may be of a thickness between about 30 nm and about 100 nm.

After depositing the a-C layer and the planarizing photoresist layer, the method 1100 proceeds to box 1104. In box 1104, the photoresist layer is patterned with a feature pattern to be etched to expose the centers of the steps of the staircase layer stack substrate. For example, FIGS. 12B and 13B illustrate a cross-sectional view and an aerial view schematic diagram of the staircase layer stack substrate 200 after patterning the photoresist layer 1204 with a feature 1216 over the center of the steps and exposing the top of the a-C layers 1202 above the center of the steps of the staircase layer stack substrate 200 in box 1104. The photoresist layer may be patterned using conventional photolithography techniques. And the photoresist layer may be any suitable photoresist known in the art.

Figures 12C, 12D, 13C, 13D:
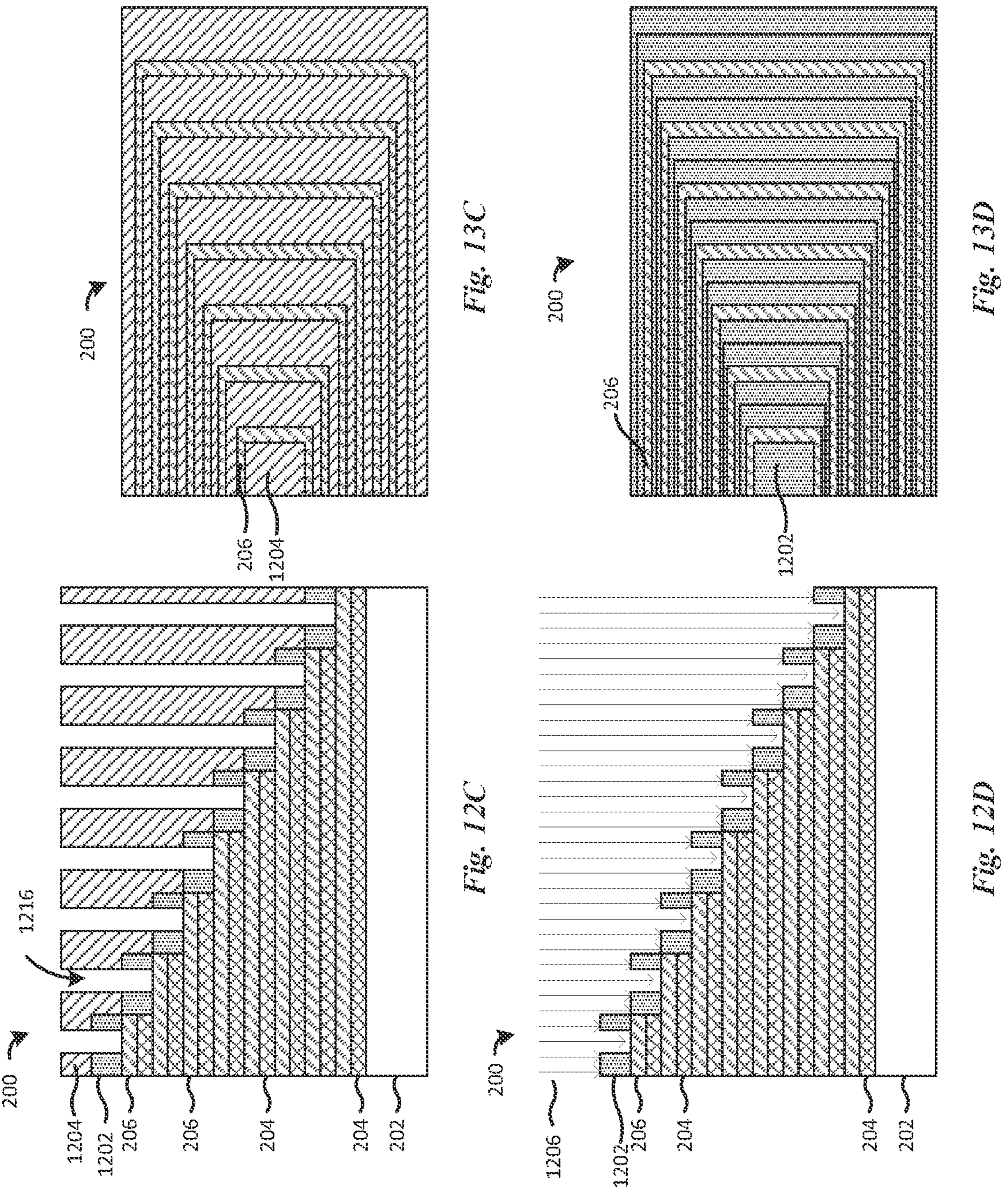

And after patterning the photoresist layer in box 1104, the method 1100 proceeds to box 1106. In box 1106, the method 1100 etches the exposed a-C layer to expose the upper second layer at the center of the steps of the staircase layer stack substrate. The etching of the a-C layer may be any etch process using an etch recipe selective to etching a-C and not the material of the upper second layer. Because the a-C layers on top of each step are the same thickness, the etch process may etch all of the a-C layers simultaneously for a set amount of time. And because the etch process is selective to a-C over the material of the upper second layer, any over-etch that may occur is negligible. FIGS. 12C and 13C illustrate a cross-sectional view and an aerial view schematic diagram of the staircase layer stack substrate 200 after etching the a-C layer 1202 to form the features 1216 in box 1106 of FIG. 11.

Figures 12E, 12F, 13E, 13F:
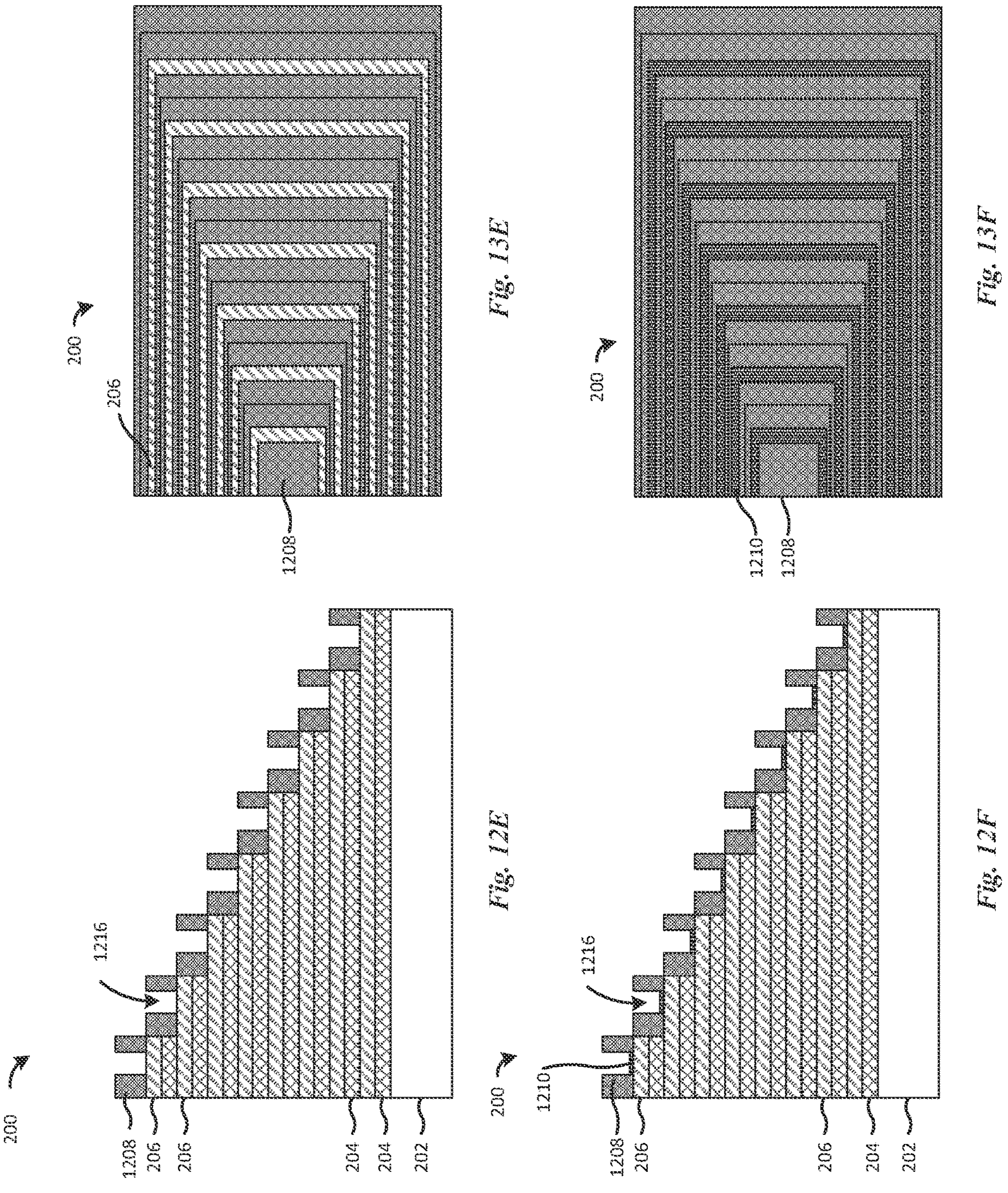

Referring back to FIG. 11, in box 1108, the method 1100 removes the photoresist layer and then treats the a-C layer with $H_2$ plasma, where the removal of the photoresist layer decreases the distance elements of the $H_2$ plasma traverse to reach the a-C layer and the treatment removes surface oxygen and inhibits precursor adsorption. The removal of the photoresist layer may be performed by any suitable method known in the art. Box 1108 may be illustrated as the cross-sectional view and aerial view schematic diagrams of FIGS. 12D and 13D. An $H_2$ plasma 1206 is illustrated in FIG. 12D, and the $H_2$ plasma 1206 is used to treat the a-C layer 1202 to remove oxygen and inhibit precursor adsorption to form a treated a-C layer so that an ALD process (or any other suitable deposition process) may deposit an etch stop region over the exposed second layer 206. In other words, the $H_2$ plasma 1206 passivates the a-C layer 1202. In an embodiment, the $H_2$ plasma 1206 may be generated in a plasma enhanced atomic layer deposition (PEALD) chamber, where an argon inert gas flow is used in combination with an $H_2$ plasma flow, followed by an argon purge in order to expose the a-C layer 1202 to a pure $H_2$ plasma 1206 to passivate the a-C layer 1202. The $H_2$ plasma 1206 is not energetic enough to cause significant etching of the second layer 206. FIGS. 12E and 13E illustrate a cross-sectional view and aerial view schematic diagram of the staircase layer stack substrate 200 after removing the photoresist layer and forming a treated a-C layer 1208 by treating the a-C layer 1202 with the $H_2$ plasma 1206 according to box 1108 of FIG. 11.

Referring to FIG. 11, in box 1110, the method 1100 performs an ALD process in order to deposit an etch stop region on the exposed second layer, and because of the $H_2$ plasma treatment to form a treated a-C layer in box 1108, the etch stop region is only deposited over the exposed portion of the second layer without sticking to the sides of the treated a-C layer. FIGS. 12F and 13F illustrate cross-sectional view and aerial view schematic diagrams of the staircase layer stack substrate 200 after depositing etch stop regions 1210 through an ALD process according to the method 1100 described in box 1110 of FIG. 11. The etch stop regions 1210 may be any suitable material that has good selectivity over oxide or nitride films, or good selectivity over any other materials of the first layer 204 and second layer 206. As a result, the etch stop region 1210 is also able to be wet or dry etched using various chemistries selective to the layers of the staircase layer stack substrate 200. In various embodiments, the etch stop regions 1210 are TiN, and the etch stop regions 1210 may be etched using a plasma generated from a gas mixture comprising $Cl_2$/Ar.

After depositing the etch stop region, the method 1100 removes the treated a-C layer without removing the etch stop region in box 1112. The removal of the treated a-C layer may be done by any suitable process capable of removing the treated a-C layer without removing the etch stop region and damaging any underlying layers, such as the upper second layer of the staircase layer stack substrate.

Figures 12G, 13G:
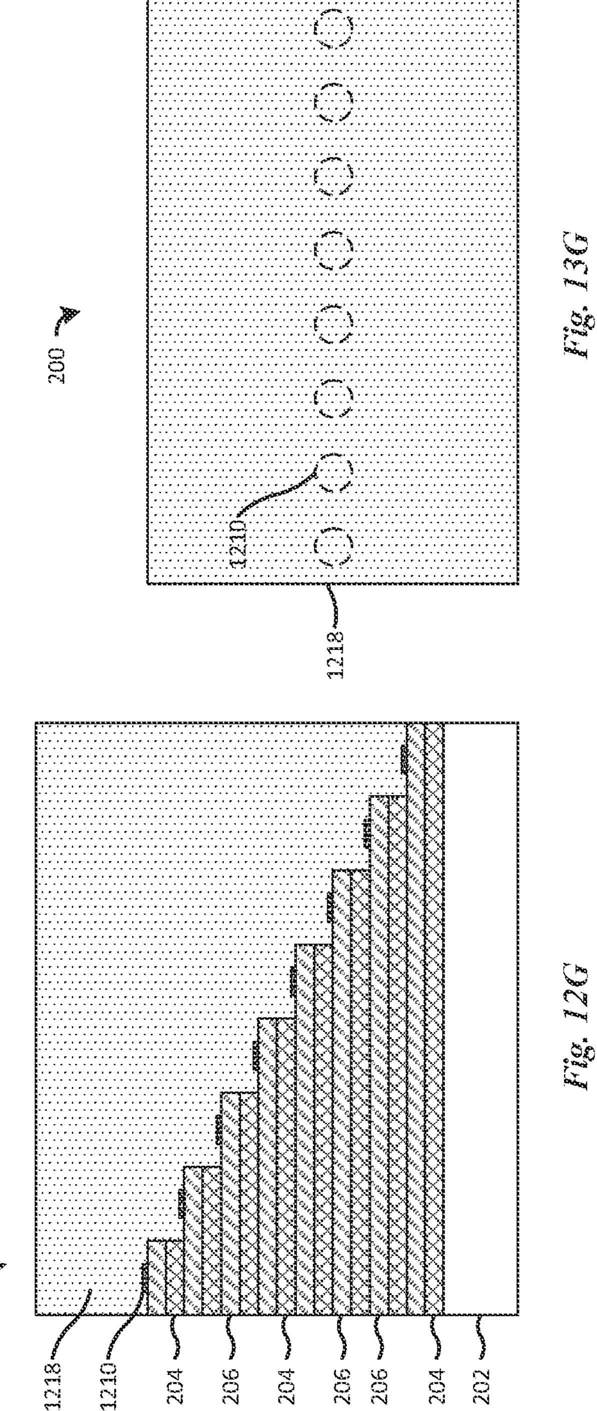

Once the method 1100 has removed the treated a-C layer, the method 1100 proceeds to box 1114. In box 1114, the method 1100 deposits a planarizing layer over the staircase layer stack substrate. The deposition of the planarizing layer may be accomplished by any suitable deposition process capable of depositing a planarizing layer over the staircase layer stack substrate. The planarizing layer may be any suitable material for etching the features according to the process recipe to form contacts on the semiconductor device. In an embodiment, the planarizing layer may be an oxide layer. An example of the staircase layer stack substrate 200 after removing the treated a-C layer in box 1112, and after depositing a planarizing layer 1218 in box 1114 is illustrated in the cross-sectional view schematic diagram of FIG. 12G and the aerial view schematic diagram of FIG. 13G. A dotted circle of a critical dimension of the etch stop regions 1210 is illustrated in FIG. 13G to illustrate the etch stop regions 1210 below the planarizing layer 1218.

After depositing the planarizing layer, the method 1100 proceeds to box 1116 in FIG. 11. In box 1116, the method 1100 replaces the second layers with conductive material to form conductive layers. The replacement of the second layers with conductive material may be performed using conventional techniques, such as by an isotropic etch process that selectively etches the material of the second layer over the material of the first layer. For example, in an embodiment where the material of the first layer is silicon oxide and the material of the second layer is silicon nitride, the etch process may selectively etch silicon nitride. In another embodiment, the second layers may be nitride layers and may be wet etched with $H_3PO_4$. After the isotropic etch of the second layers, a conductive material is deposited in the spaces where the second layers were in order to form a conductive layer in each space. In various embodiments, the conductive layer is tungsten, which may be deposited through a suitable technique, such as ALD, CVD, PEALD, and/or PECVD. In some embodiments, a barrier layer and/or a tungsten nucleation layer is deposited prior to depositing bulk tungsten.

Figures 14A, 14B, 15A, 15B:
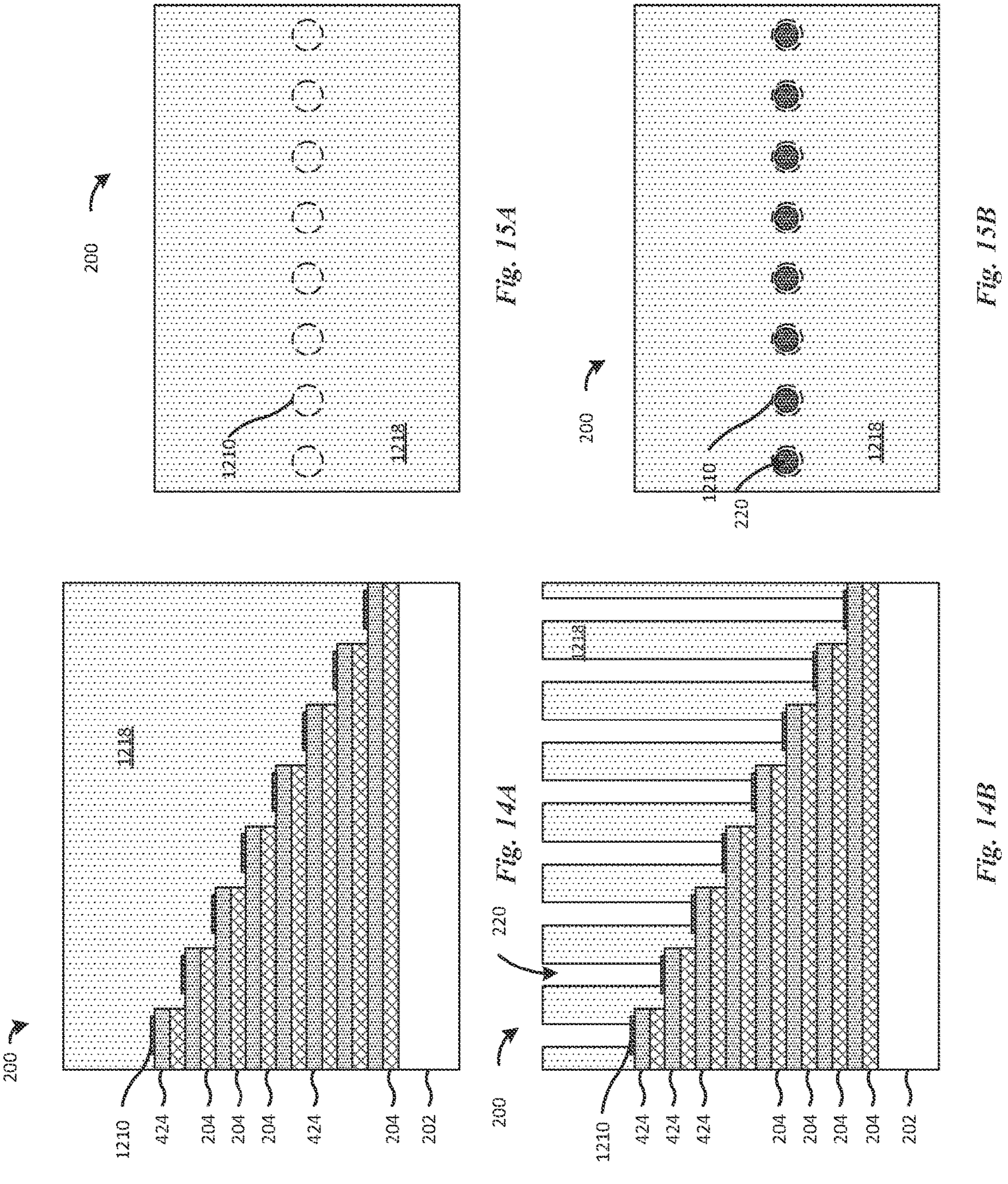
FIGS. 14A-14C are schematic diagrams in a cross-sectional view illustrating a substrate processing method of FIG. 11 according to an embodiment.
FIGS. 15A-15C are schematic diagrams in an aerial view illustrating a substrate processing method corresponding to FIGS. 14A-14C according to an embodiment.

FIGS. 14A and 15A illustrate a cross-sectional view and an aerial view of the staircase layer stack substrate 200 after replacing each of the second layers 206 with conductive material to form a conductive layer 424 in box 1116 of the method 1100. The conductive layer 424 may be any suitable material deposited through any suitable process for fabricating the semiconductor device according to the process recipe, such as tungsten.

After replacing the second layers with conductive material, the method 1100 proceeds to box 1118. In box 1118, the method 1100 etches the planarizing layer using an appropriate technique to reveal the etch stop region at the center of the steps of the staircase layer stack substrate and to start forming the contact features. For example, the conventional technique would involve depositing and patterning a new photoresist layer. The patterning comprises a feature pattern for forming contacts with the conductive layers of the staircase layer stack substrate. And after patterning the new photoresist layer, etching the feature pattern to expose the etch stop region. Other embodiments may also comprise masking steps.

FIGS. 14B and 15B illustrate the staircase layer stack substrate 200 after etching the planarizing layer 1218 to expose the etch stop regions 1210 and start to form a contact feature 220 on each step as described in box 1118 of method 1100 in FIG. 11. FIG. 15B illustrates the etch stop regions 1210 having a larger critical dimension than the contact feature 220. The contact feature 220 may have a critical dimension between about 50 nm and about 500 nm. As a result of using the etch stop regions 1210, the method 1100 may simultaneously etch the contact features for all steps of the staircase layer stack substrate 200 without over-etching the conductive layer 424, because the etching process of box 1118 is not selective to the material of the etch stop regions 1210.

Figures 14C, 15C:
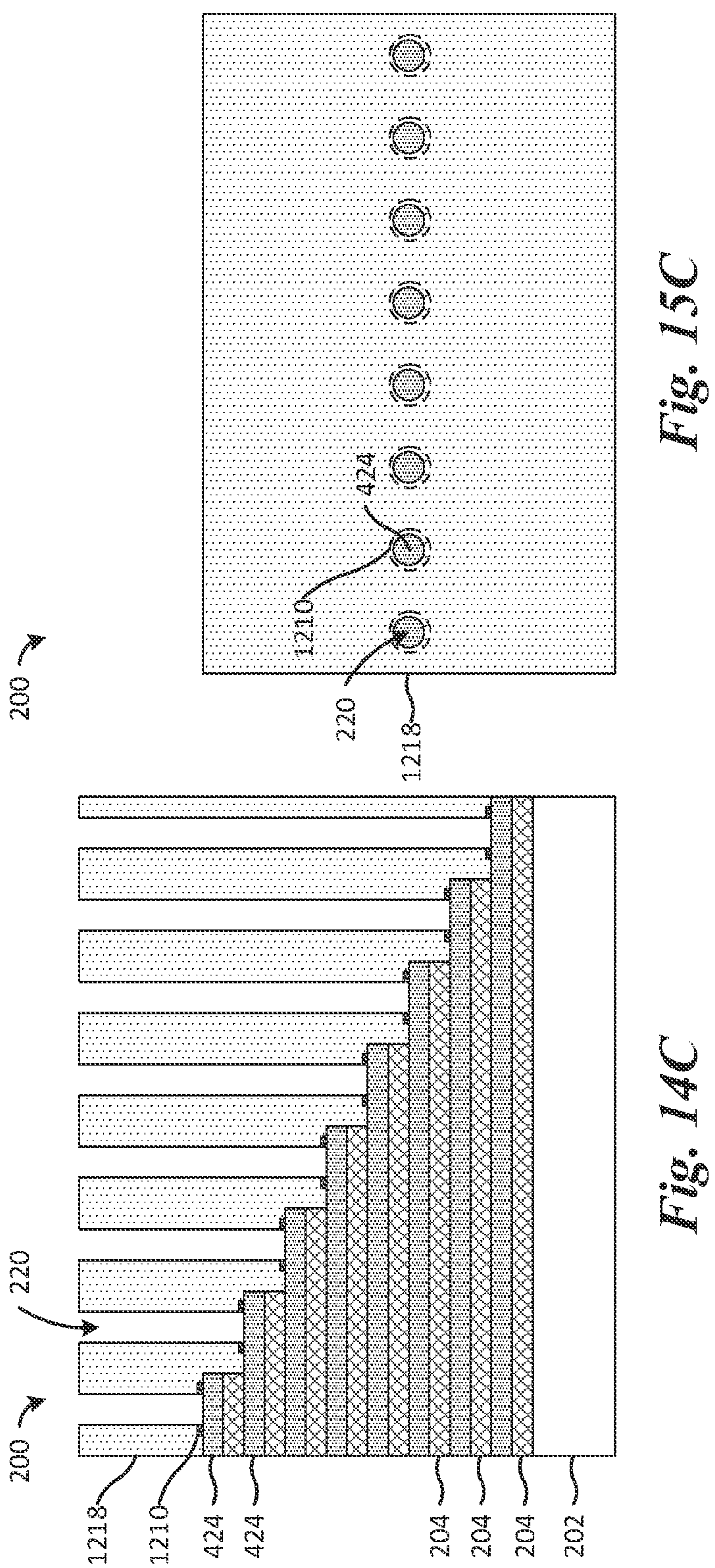

And referring back to FIG. 11, in box 1120, the method 1100 etches the etch stop region to finish forming the contact feature on each step. Because each step has an etch stop region of the same thickness, etching through the etch stop region may be performed simultaneously, and the etching of the etch stop region does not over-etch the contact feature into the conductive layer. FIGS. 14C and 15C illustrate the staircase layer stack substrate 200 after etching the etch stop regions 1210 through to the conductive layer 424 according to box 1120 of the method 1100 in FIG. 11.

In various embodiments, after box 1120 of the method 1100 in FIG. 11, the contact feature 220 of FIG. 14C may be filled with a conductive material to finish forming the contacts of the semiconductor device. The filling of the contact features 220 with conductive material may be done by the methods described above for the methods 100 and 600 of FIGS. 1 and 6, respectively. Included in the benefits of the method 1100 in comparison to conventional techniques for forming contacts are that the method 1100 may etch all of the contact features simultaneously without over-etching the conductive layers, and that the total number of steps for fabricating contacts of a semiconductor device are reduced.

Another benefit of using an etch stop layer in the forming of contacts as described above for methods 100, 600, and 1100 is the total number of processing steps is reduced in comparison to conventional techniques (which reduces the overall processing time to fabricate a semiconductor device). Conventional techniques use an etch and then plug and then etch cycle to etch the contacts to avoid over-etching underlying conductive layers. The methods 100, 600, and 1100 described in this disclosure do not use plugs because the etch stop layer and etch stop regions prevents the etch process from punching through overlying layers and over-etching the conductive layer beneath.

Each of the methods (100, 600, and 1100) described above of using an etch stop layer to form contacts simplify the process steps for fabricating these semiconductor devices. As a result, the methods have good yield, reduce manufacturing costs, reduce total manufacturing time, and have good throughput with the potential to have high ON layer memory.

Example embodiments of the invention are described below. Other embodiments can also be understood from the entirety of the specification as well as the claims filed herein.

Example 1. A method of forming contacts includes forming a conformal etch stop layer over a staircase layer stack substrate, the staircase layer stack substrate including a plurality of steps on a substrate, each step including a pair of a first layer and a second layer and having a sidewall extending from one step to another step. The method further includes patterning the etch stop layer to remove portions of the etch stop layer covering the sidewalls of the steps and form islands of the etch stop layer. The method further includes replacing the second layer with a conductive material and simultaneously forming contact features through the islands of the etch stop layer to the conductive material, the contact features to different steps of the plurality of steps having different lengths.

Example 2. The method of example 1, further includes filling the contact features with a conductive metal to form a plurality of contact vias with different lengths.

Example 3. The method of one of examples 1 or 2, further includes forming a 3D NAND device, an active region of the 3D NAND device being coupled using the plurality of contact vias.

Example 4. The method of one of examples 1 to 3 where, in each step, the second layer is between the etch stop layer and the first layer.

Example 5. The method of one of examples 1 to 4, where the etch stop layer is TiN, the first layer is an oxide layer, the second layer is a nitride layer, the substrate is a silicon wafer, and the conductive material is tungsten.

Example 6. The method of one of examples 1 to 5, where patterning the etch stop layer includes depositing a protective layer over the etch stop layer, depositing and patterning a planarizing layer over the protective layer to expose the protective layer on the sidewalls of the staircase layer stack substrate, and etching the exposed protective layer and an underlying portion of the etch stop layer until the sidewall of each of the plurality of steps is exposed.

Example 7. The method of one of examples 1 to 6, where the protective layer is an oxide layer, and the planarizing layer is an amorphous-carbon (a-C) layer.

Example 8. The method of one of examples 1 to 7, where patterning the etch stop layer includes depositing a planarizing layer over the etch stop layer, depositing and patterning a photoresist layer over the planarizing layer, etching the planarizing layer to expose the etch stop layer on the sidewalls of the staircase layer stack substrate, and etching the exposed etch stop layer on the sidewalls of the staircase layer stack substrate until the upper second layer is exposed.

Example 9. The method of one of examples 1 to 8, where the planarizing layer is oxide.

Example 10. A method of forming contacts includes forming a conformal amorphous layer over a staircase layer stack substrate, the staircase layer stack substrate including a plurality of steps on a substrate, each step including a pair of a first layer and a second layer and having a sidewall extending from one step to another step. The method further includes forming first openings within the amorphous layer using a first mask including a pattern for first features. The method further includes exposing the amorphous layer to a hydrogen plasma. After the exposing, the method further includes selectively depositing, using an area selective deposition process, etch stop regions within the first openings. The method further includes replacing the second layer with a conductive material. And the method further includes simultaneously forming contact features through the etch stop regions to the conductive material, the contact features to different steps of the plurality of steps having different lengths.

Example 11. The method of example 10, where the contact features are formed using a second mask including a pattern for the contact features, the pattern for the first openings being aligned with the pattern for the contact features, the first openings having a larger critical dimension than the contact features.

Example 12. The method of one of examples 10 or 11, further includes depositing a planarizing layer over the etch stop regions, the contact features being formed within the planarizing layer.

Example 13. The method of one of examples 10 to 12, where, in each step, the second layer is between the etch stop regions and the first layer.

Example 14. The method of one of examples 10 to 13, where the amorphous layer is amorphous-carbon (a-C), the etch stop layer is TiN, the first layer is an oxide layer, the second layer is a nitride layer, the substrate is a silicon wafer, and the conductive material is tungsten.

Example 15. The method of one of examples 10 to 14, further includes filling the contact features with a conductive metal to form a plurality of contact vias with different lengths.

Example 16. A substrate processing method includes depositing an etch stop layer over a staircase layer stack substrate, the staircase layer stack substrate including a plurality of steps, each step including a pair of a first layer and a second layer and having an edge with a sidewall extending from one step to another step. The substrate processing method further includes depositing a protective layer over the etch stop layer, and depositing and patterning a planarizing layer over the protective layer to expose the protective layer on the sidewalls of the staircase layer stack substrate. The substrate processing method further includes etching the exposed protective layer and an underlying portion of the etch stop layer until the sidewall of each of the plurality of steps is exposed, the etching removing portions of the etch stop layer from the sidewalls between steps of the staircase layer stack substrate. And the substrate processing method further includes depositing a second planarizing layer over the staircase layer stack substrate.

Example 17. The method of example 16, where depositing the etch stop layer includes an atomic layer deposition (ALD) process.

Example 18. The method of one of examples 16 or 17, the method further includes replacing the second layers of the staircase layer stack substrate with a conductive material, and patterning the second planarizing layer to expose the etch stop layer. And the method further includes etching the exposed etch stop layer to expose the upper conductive layer and form a set of features.

Example 19. The method of one of examples 16 to 18, where the etch stop layer is TiN, the first layer is an oxide layer, the second layer is a nitride layer, the substrate is a silicon wafer, the protective layer is an oxide layer, the planarizing layer is an amorphous-carbon (a-C) layer, the second planarizing layer is oxide, the conductive material is tungsten, and the set of features is a plurality of contact features.

Example 20. The method of one of examples 16 to 19, further includes filling the contact features with a conductive metal to form a plurality of contact vias with different lengths. And the method further includes forming a 3D NAND device, an active region of the 3D NAND device being coupled using the plurality of contact vias.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming contacts, the method comprising:

forming a conformal etch stop layer over a staircase layer stack substrate, the staircase layer stack substrate comprising a plurality of steps on a substrate, each step comprising a pair of a first layer and a second layer and having a sidewall extending from one step to another step;

patterning the etch stop layer to remove portions of the etch stop layer covering the sidewalls of the steps and form islands of the etch stop layer;

wherein patterning the etch stop layer comprises:

depositing a planarizing layer over the etch stop layer;

depositing and patterning a photoresist layer over the planarizing layer;

etching the planarizing layer to expose the etch stop layer on the sidewalls of the staircase layer stack substrate;

etching the exposed etch stop layer on the sidewalls of the staircase layer stack substrate until the upper second layer is exposed;

replacing the second layer with a conductive material; and simultaneously forming contact features through the islands of the etch stop layer to the conductive material, the contact features to different steps of the plurality of steps having different lengths.

2. The method of claim 1, further comprising:

filling the contact features with a conductive metal to form a plurality of contact vias with different lengths.

3. The method of claim 2, further comprising:

forming a 3D NAND device, an active region of the 3D NAND device being coupled using the plurality of contact vias.

4. The method of claim 1 wherein, in each step, the second layer is between the etch stop layer and the first layer.

5. The method of claim 1, wherein the etch stop layer is TiN, the first layer is an oxide layer, the second layer is a nitride layer, the substrate is a silicon wafer, and the conductive material is tungsten.

6. The method of claim 1, wherein patterning the etch stop layer comprises:

depositing a protective layer over the etch stop layer;

depositing and patterning a planarizing layer over the protective layer to expose the protective layer on the sidewalls of the staircase layer stack substrate; and etching the exposed protective layer and an underlying portion of the etch stop layer until the sidewall of each of the plurality of steps is exposed.

7. The method of claim 6, wherein the protective layer is an oxide layer, and the planarizing layer is an amorphous-carbon (a-C) layer.

8. The method of claim 1, wherein the planarizing layer is oxide.

9. A method of forming contacts, the method comprising:

forming a conformal amorphous layer over a staircase layer stack substrate, the staircase layer stack substrate comprising a plurality of steps on a substrate, each step comprising a pair of a first layer and a second layer and having a sidewall extending from one step to another step;

forming first openings within the amorphous layer using a first mask comprising a pattern for first features;

exposing the amorphous layer to a hydrogen plasma;

after the exposing, selectively depositing, using an area selective deposition process, etch stop regions within the first openings;

replacing the second layer with a conductive material; and simultaneously forming contact features through the etch stop regions to the conductive material, the contact features to different steps of the plurality of steps having different lengths.

10. The method of claim 9, wherein the contact features are formed using a second mask comprising a pattern for the contact features, the pattern for the first openings being aligned with the pattern for the contact features, the first openings having a larger critical dimension than the contact features.

11. The method of claim 9, further comprising:

depositing a planarizing layer over the etch stop regions, the contact features being formed within the planarizing layer.

12. The method of claim 9, wherein, in each step, the second layer is between the etch stop regions and the first layer.

13. The method of claim 9, wherein the amorphous layer is amorphous-carbon (a-C), the etch stop layer is TiN, the first layer is an oxide layer, the second layer is a nitride layer, the substrate is a silicon wafer, and the conductive material is tungsten.

14. The method of claim 9, further comprising:

filling the contact features with a conductive metal to form a plurality of contact vias with different lengths.

15. A substrate processing method comprising:

depositing an etch stop layer over a staircase layer stack substrate, the staircase layer stack substrate comprising a plurality of steps, each step comprising a pair of a first layer and a second layer and having an edge with a sidewall extending from one step to another step;

depositing a protective layer over the etch stop layer;

depositing and patterning a planarizing layer over the protective layer to expose the protective layer on the sidewalls of the staircase layer stack substrate;

etching the exposed protective layer and an underlying portion of the etch stop layer until the sidewall of each of the plurality of steps is exposed, the etching removing portions of the etch stop layer from the sidewalls between steps of the staircase layer stack substrate;

depositing a second planarizing layer over the staircase layer stack substrate; and replacing the second layers of the staircase layer stack substrate with a conductive material;

patterning the second planarizing layer to expose the etch stop layer; and etching the exposed etch stop layer to expose the upper conductive layer and form a set of features.

16. The method of claim 15, wherein depositing the etch stop layer comprises an atomic layer deposition (ALD) process.

17. The method of claim 15, wherein the etch stop layer is TIN, the first layer is an oxide layer, the second layer is a nitride layer, the substrate is a silicon wafer, the protective layer is an oxide layer, the planarizing layer is an amorphous-carbon (a-C) layer, the second planarizing layer is oxide, the conductive material is tungsten, and the set of features is a plurality of contact features.

18. The method of claim 17, further comprising:

filling the contact features with a conductive metal to form a plurality of contact vias with different lengths; and forming a 3D NAND device, an active region of the 3D NAND device being coupled using the plurality of contact vias.

* * * * *